United States Patent
Van Heijningen et al.

(10) Patent No.: US 6,941,258 B2
(45) Date of Patent: Sep. 6, 2005

(54) METHOD, APPARATUS AND COMPUTER PROGRAM PRODUCT FOR DETERMINATION OF NOISE IN MIXED SIGNAL SYSTEMS

(75) Inventors: Marc Van Heijningen, Leuven (BE); Mustafa Badaroglu, Leuven (BE)

(73) Assignee: Interuniversitair Microelektronica Centrum, Leuven (BE)

(*) Notice: Subject to any disclaimer, the term of this patent is extended or adjusted under 35 U.S.C. 154(b) by 782 days.

(21) Appl. No.: 09/809,993

(22) Filed: Mar. 16, 2001

(65) Prior Publication Data

US 2002/0022951 A1 Feb. 21, 2002

Related U.S. Application Data

(60) Provisional application No. 60/190,704, filed on Mar. 17, 2000, and provisional application No. 60/266,184, filed on Feb. 2, 2001.

(51) Int. Cl.[7] .............................................. G06F 17/50
(52) U.S. Cl. ............................ 703/16; 703/2; 703/15; 703/14; 703/17; 716/6
(58) Field of Search ................................ 703/2, 14, 15, 703/16, 17, 19; 716/3, 4, 5, 6

(56) References Cited

U.S. PATENT DOCUMENTS

| | | | | |
|---|---|---|---|---|
| 5,481,484 A | * | 1/1996 | Ogawa et al. | 703/14 |
| 5,668,507 A | * | 9/1997 | Boerstler et al. | 331/78 |
| 5,828,580 A | * | 10/1998 | Ho | 716/12 |
| 5,999,726 A | * | 12/1999 | Ho | 716/11 |
| 6,144,217 A | * | 11/2000 | Iwata et al. | 326/26 |
| 6,291,322 B1 | * | 9/2001 | Clement | 438/510 |
| 6,480,986 B1 | * | 11/2002 | Richer | 716/4 |
| 6,496,955 B1 | * | 12/2002 | Chandra et al. | 716/3 |
| 6,560,572 B1 | * | 5/2003 | Balaram et al. | 703/76 |
| 6,564,355 B1 | * | 5/2003 | Smith et al. | 716/4 |
| 6,668,333 B1 | * | 12/2003 | Demir et al. | 713/500 |
| 6,785,642 B1 | * | 8/2004 | Ballam | 703/14 |

FOREIGN PATENT DOCUMENTS

EP 001134676 A1 * 9/2001 ............ G06F/17/50

OTHER PUBLICATIONS

Su et al., Experimental Results and Modeling Techniques for Substrate Noise in Mixed–signal Integrated Circuits, IEEE 1993.*

Singh et al., Efficient real–time modelling of substrate coupling in large mixed singnal Spice designs, using analogue HDL, IEE 1998.*

Loinaz et al., Experimental Results and Modeling Techniques for Switching Noise in Mixed Signal Integrated Circuits, IEEE 199.* van Heijningen et al., A Design Experiment for Measurement of the Spectral Content of Substrate Noise in Mixed-Signal Integrated Circuits, IEEE 1999.*

(Continued)

*Primary Examiner*—W. Thomson
(74) *Attorney, Agent, or Firm*—Knobbe Martens Olson & Bear LLP

(57) ABSTRACT

A simulation system is described for computing the overall signal generated in a substrate by a digital system comprising a plurality of gates associated with the substrate, wherein each gate is configured to perform a switching event. Output of a transistor-level model is compared with output of a lumped circuit model for each gate and the substrate, and signal contributions from each gate and switching event are determined based on the comparison. The system determines switching event signals for each of the plurality of gates. The signal contributions and the switching event signals are combined, and a combined lumped circuit model is derived based on a combination of lumped circuit models of the plurality of gates. The overall signal is computed based on the combined gate signal contributions and switching event signals, which are configured as an input to the combined lumped circuit model.

32 Claims, 14 Drawing Sheets

Simulation methodology flow

OTHER PUBLICATIONS van Heijningen et al., Analysis and Experimental Verification of Digital Substrate Noise Generation for Epi–Type Substrates, IEEE 2000.*

Singh et al., Method for Modelling Substrate Coupling in Large Chip Designs, IEE 1997.*

Singh et al., Efficient Modelling of Substrate Noise and Coupling in Mixed Signal SPICE Designs, IEE 1997.*

Carbon E. et al., Modeling Digital Substrate Noise Injection in Mixed–Signal IC's, (1999) IEEE Transactions vol. 18, No. 3 pp. 301–310.

Mitra S. et al., A Methodology for Rapid Estimation of Substrate–Coupled Switching Noise, (1995) IEEE Transactions Custome Integrated Circuits Conference pp. 129–132.

Nagata M. et al., Substrate Noise Simulation Techniques for Analog–Digital Mixed LSI Design, (1999) IEICE Trans. Fundamentals vol. E82 A, No. 2 pp. 271–277.

Miliozzi P. et al., Sub Wave: A Methodology for Modeling Digital Substrate Noise Injection in Mixed–Signal ICS, (1996) IEEE Custom Integrated Circuits Conference pp. 385–388.

* cited by examiner

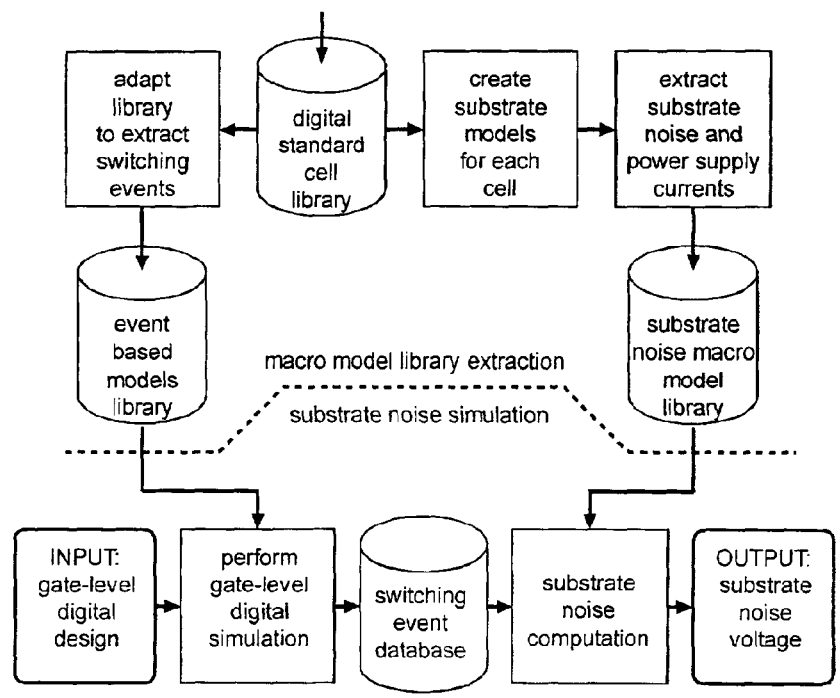
Figure 1 Substrate noise simulation methodology
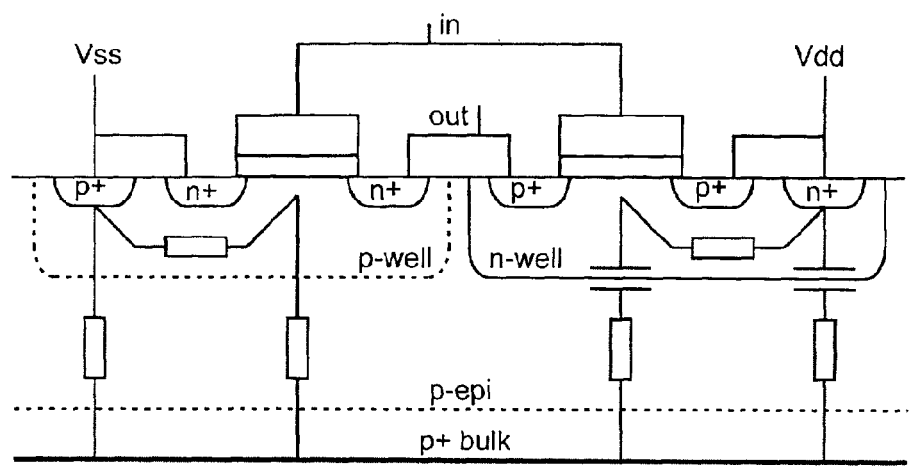
Figure 2 SPICE substrate model

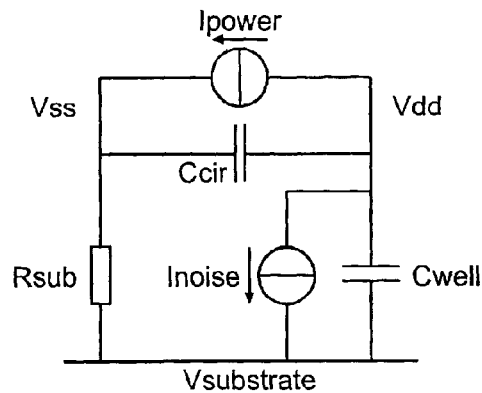
Figure 3 Macro model created for each digital gate
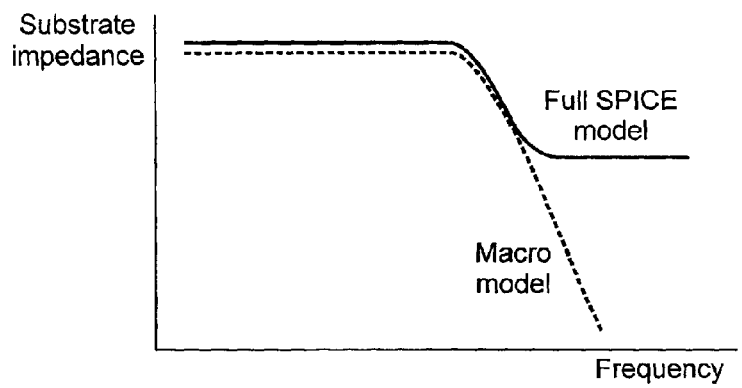
Figure 4 Comparison of substrate impedance for the full SPICE model and the macro model

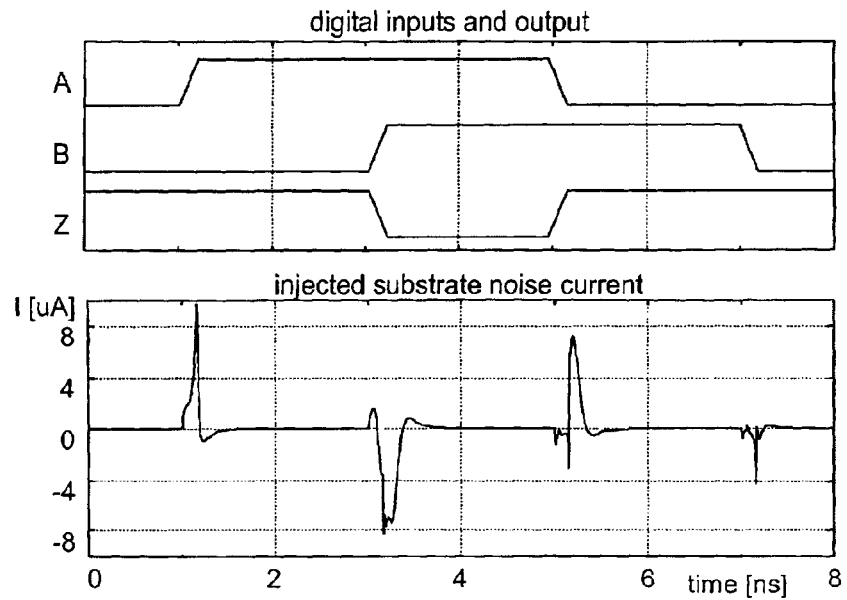
Figure 5 Injected substrate noise current for NAND gate
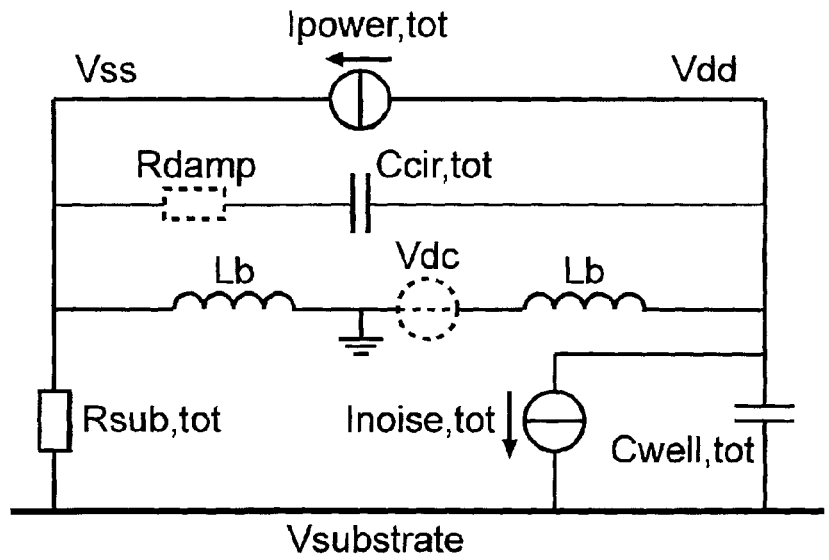
Figure 6 Equivalent substrate noise simulation circuit

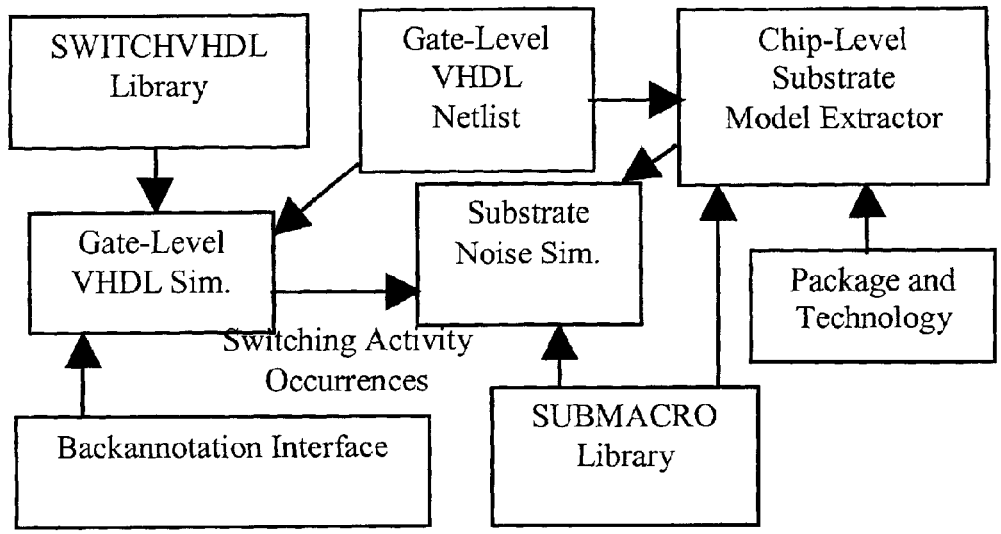
Figure 7 Simulation methodology flow
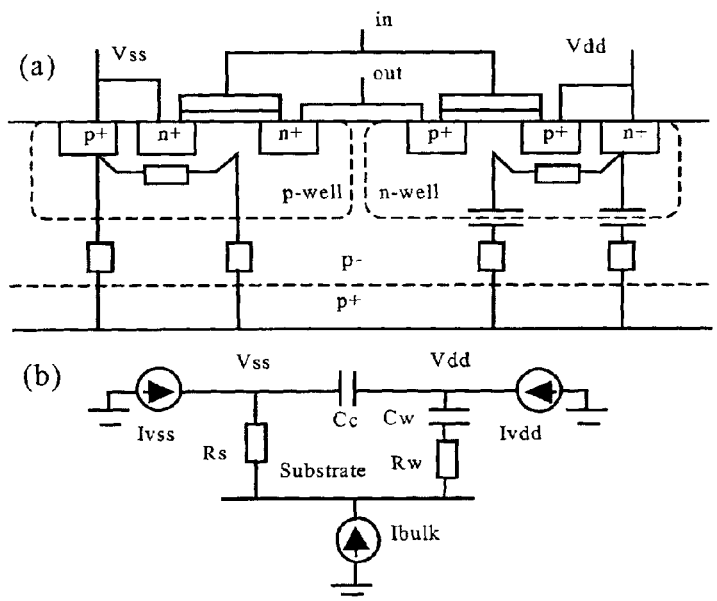
Figure 8 (a) Spice model for an inverter (b) Macro cell for a standard core cell

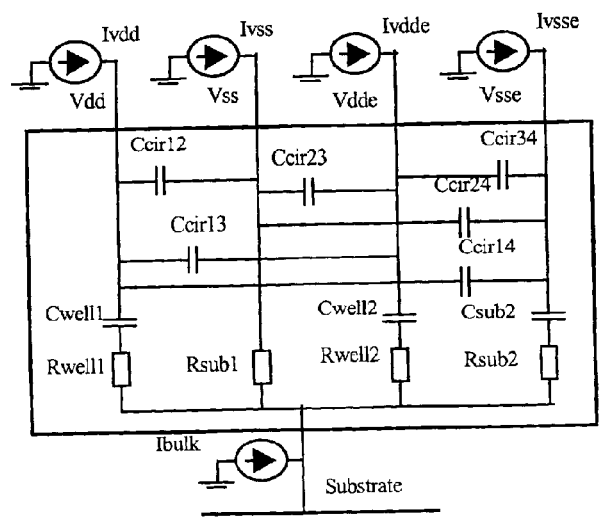
Figure 9 Macro cell model for an IO cell
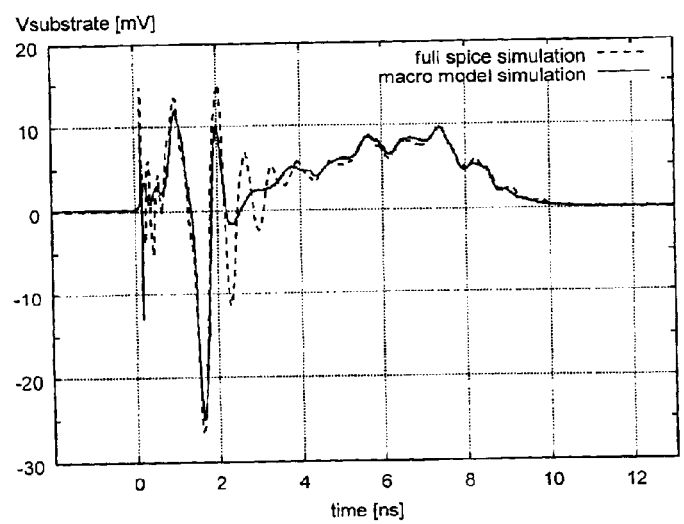
Figure 10 Substrate voltages from an IO cell for the macro cell model and SPICE model

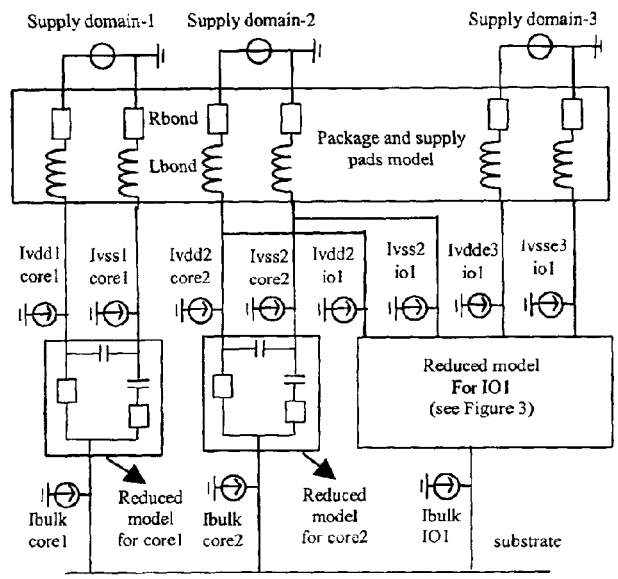
Figure 11 Equivalent chip substrate model
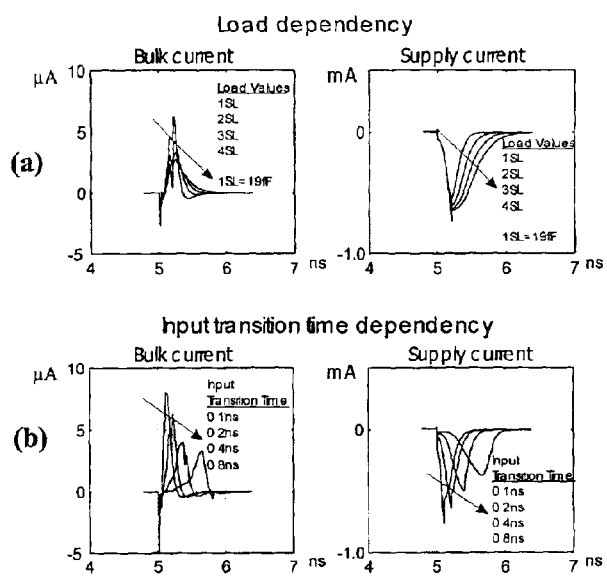
Figure 12 (a) Load and (b) input transition time dependency for an NAND2 gate

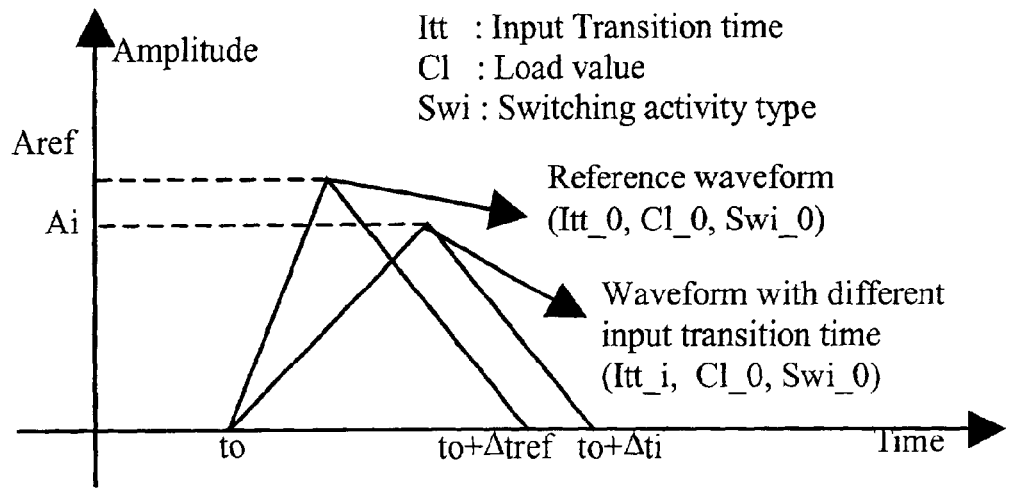
Figure 13 Input transition time effect on current
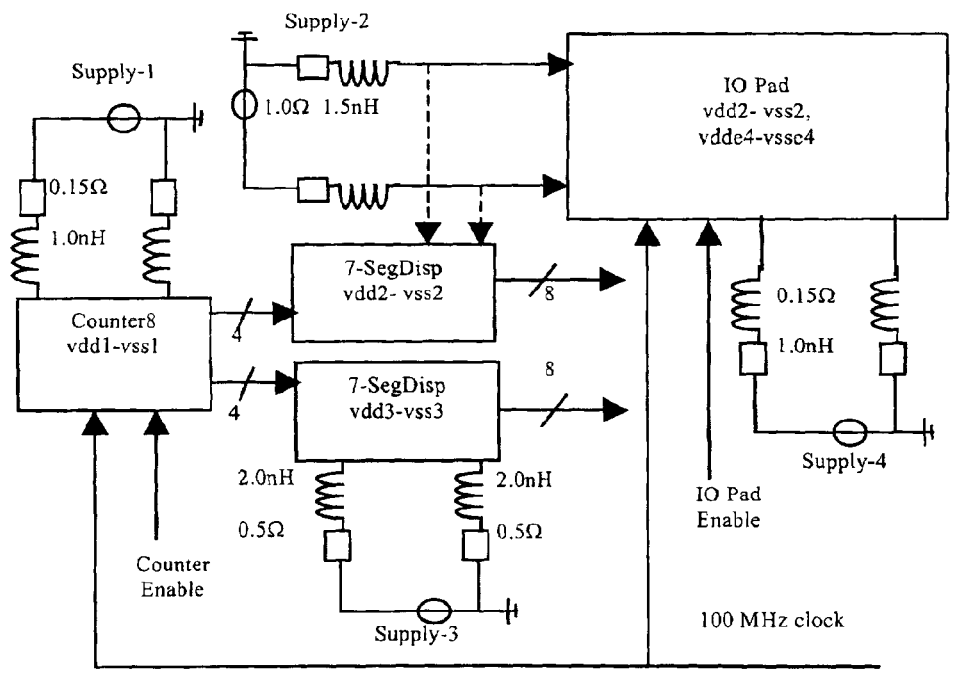
Figure 14 Architecture of count8disp

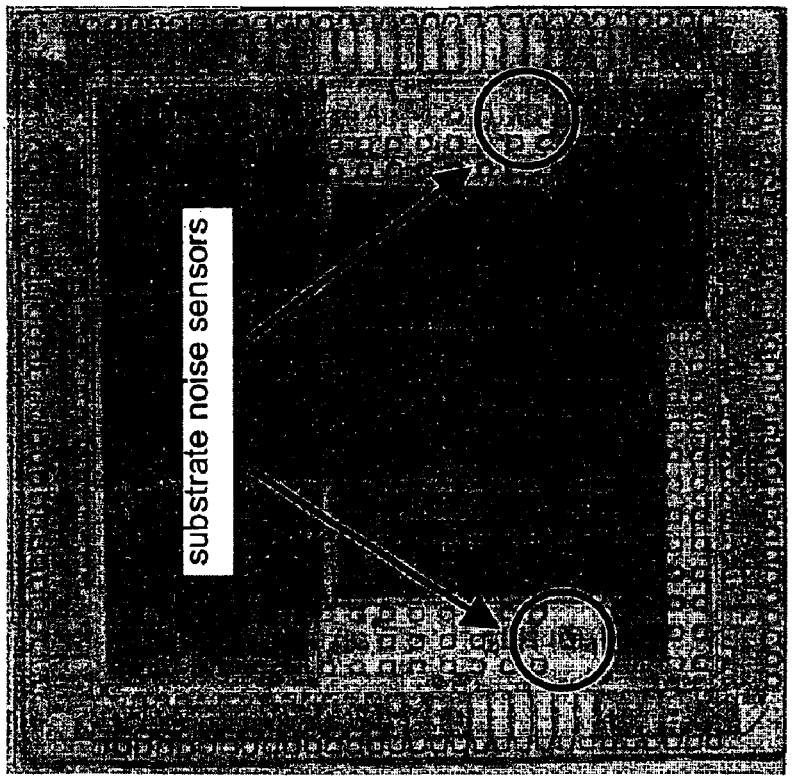
Figure 15: Microphotograph of the Robo4 chip and specifications

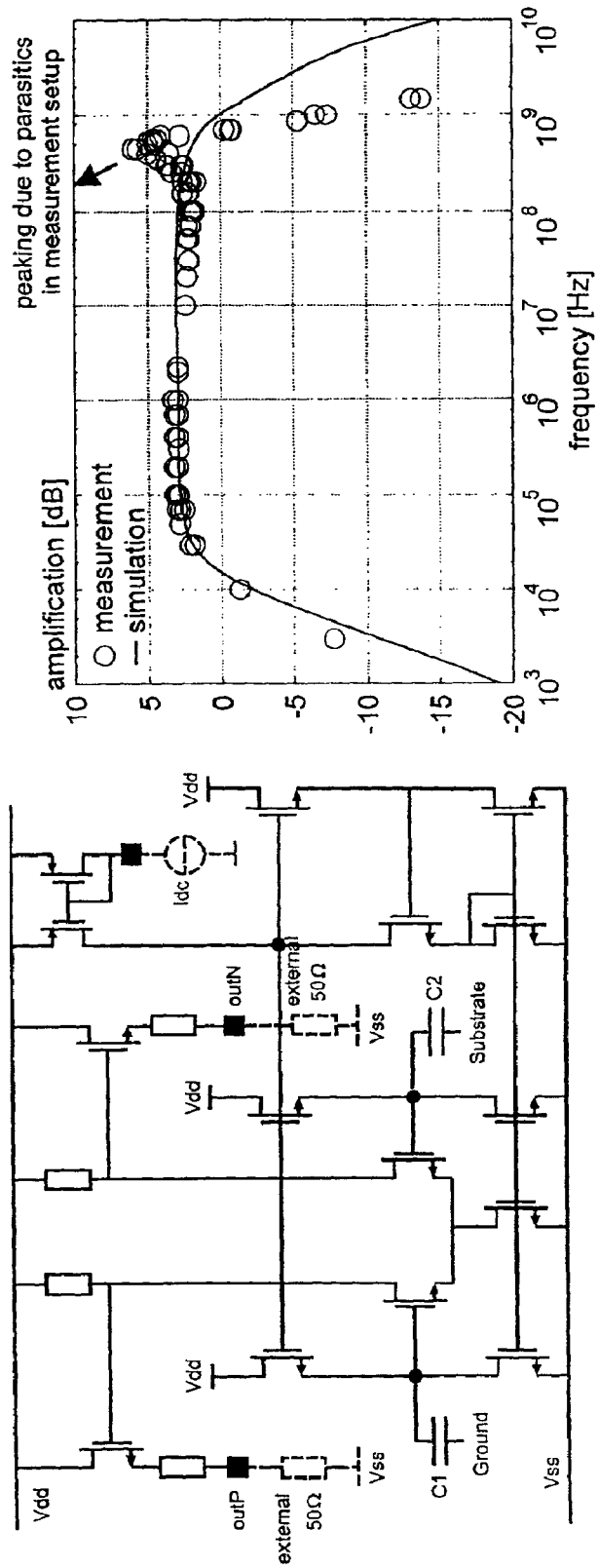
Figure 16: Schematic and transfer function of the substrate noise sensor

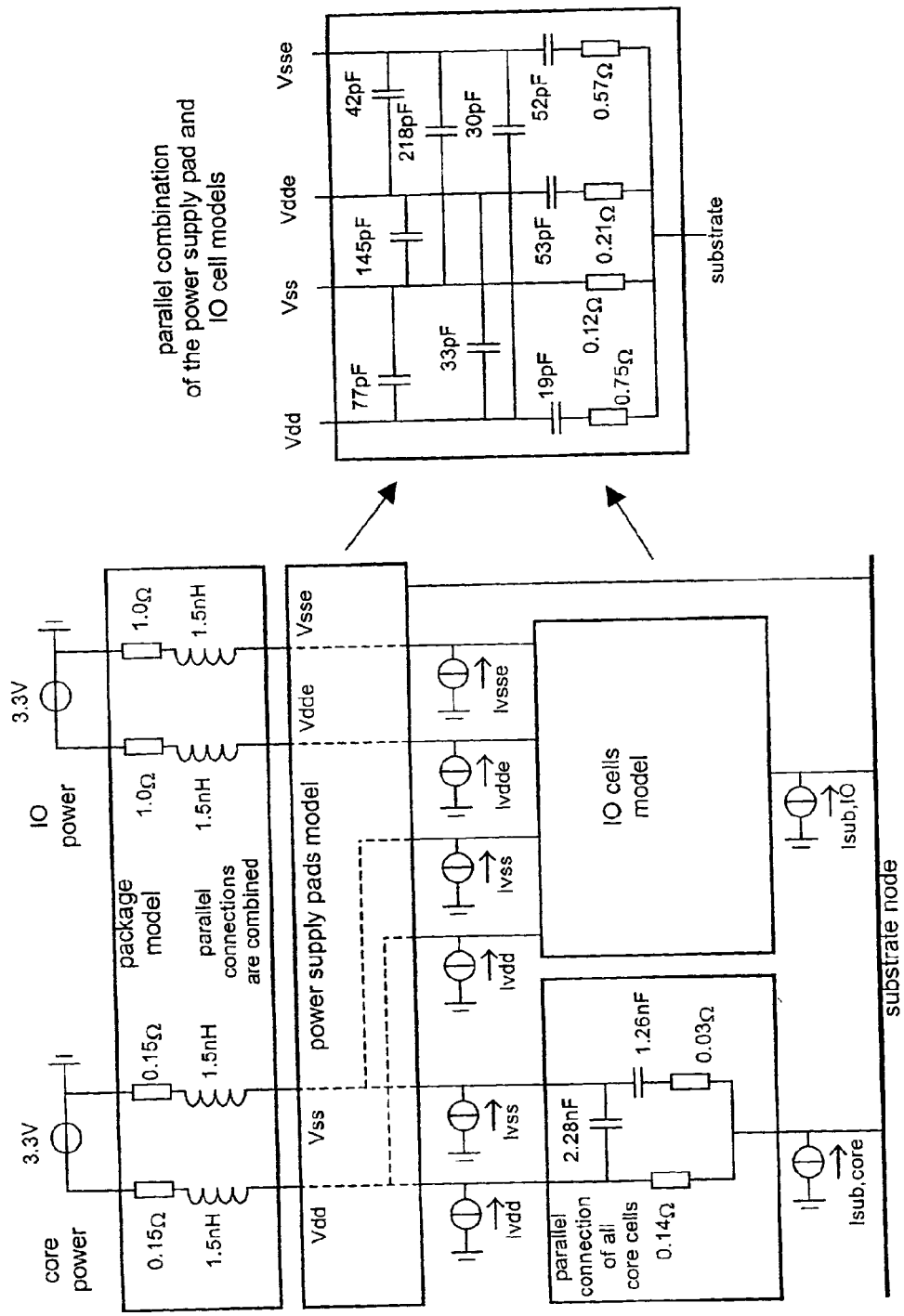
Figure 17: Simulation model for substrate noise calculations

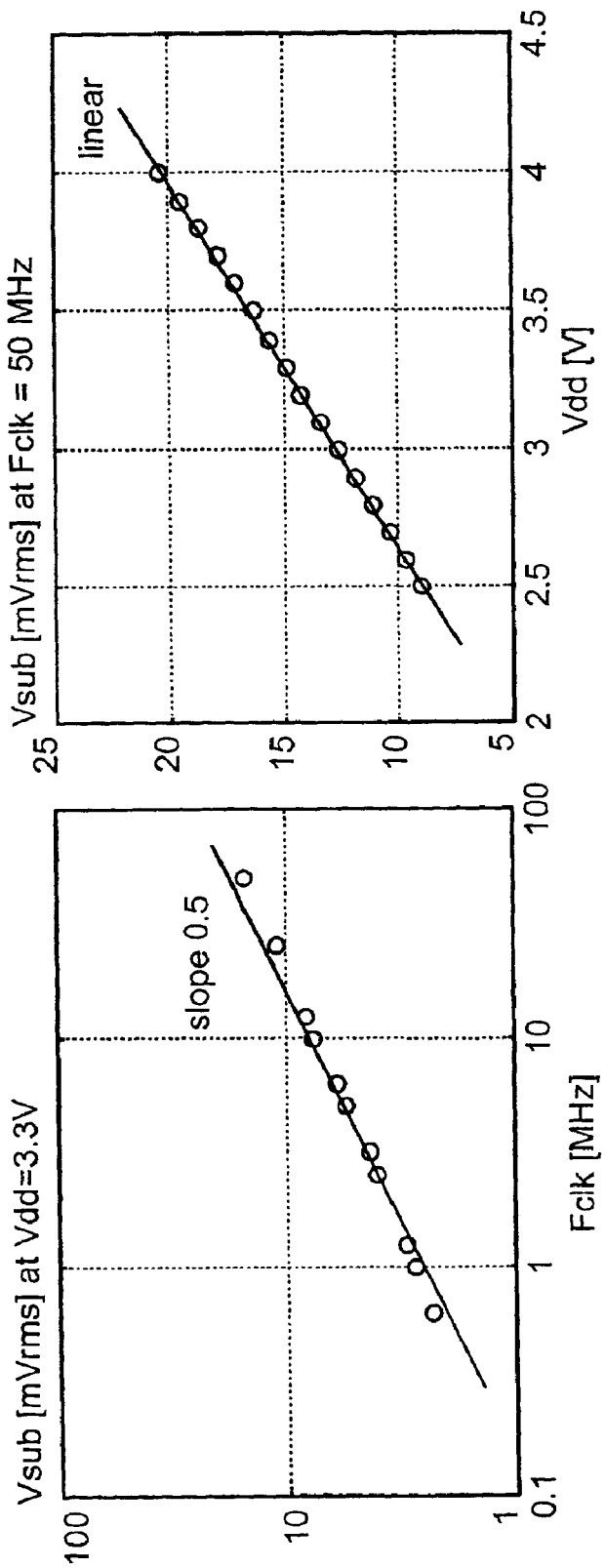
Figure 18: Measured substrate noise versus clock frequency and supply voltage

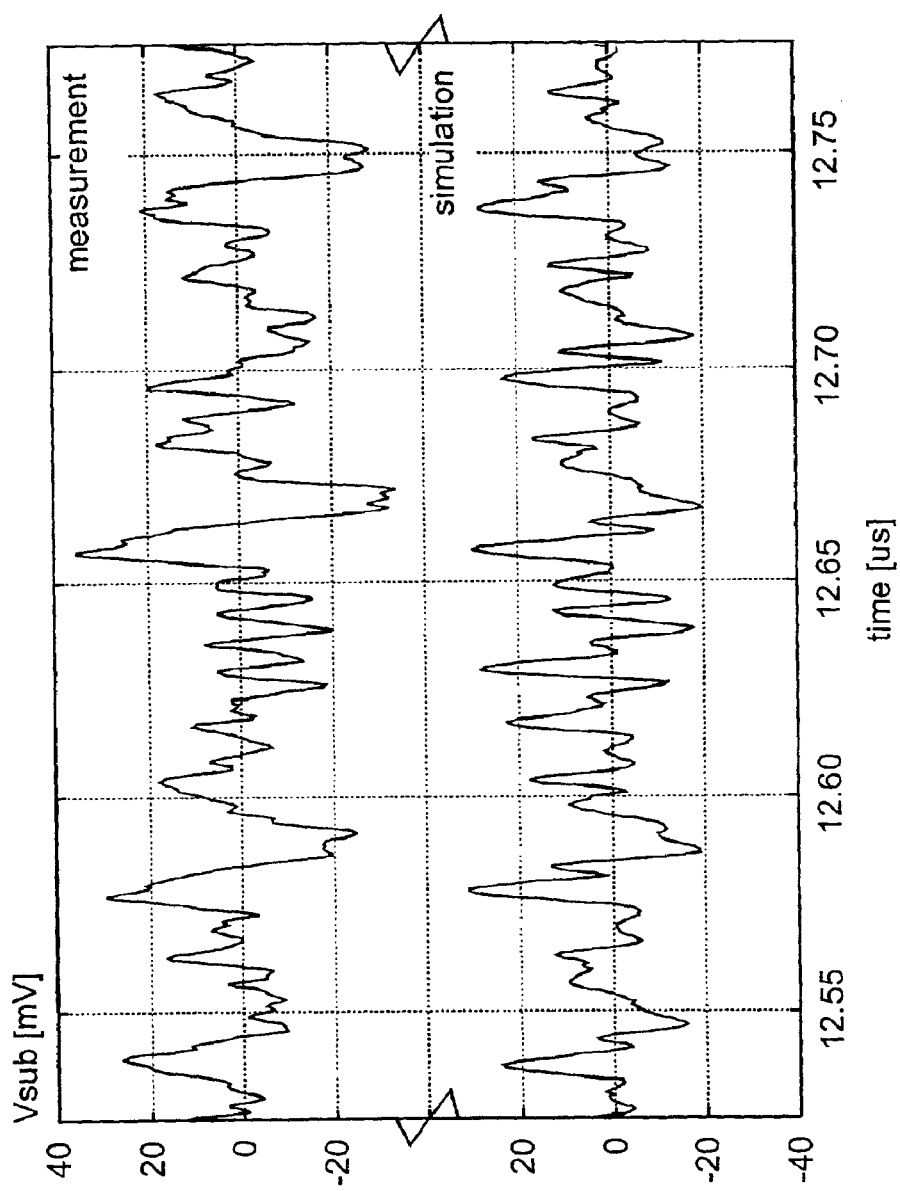
Figure 19: Comparison of measured and simulated substrate noise waveforms

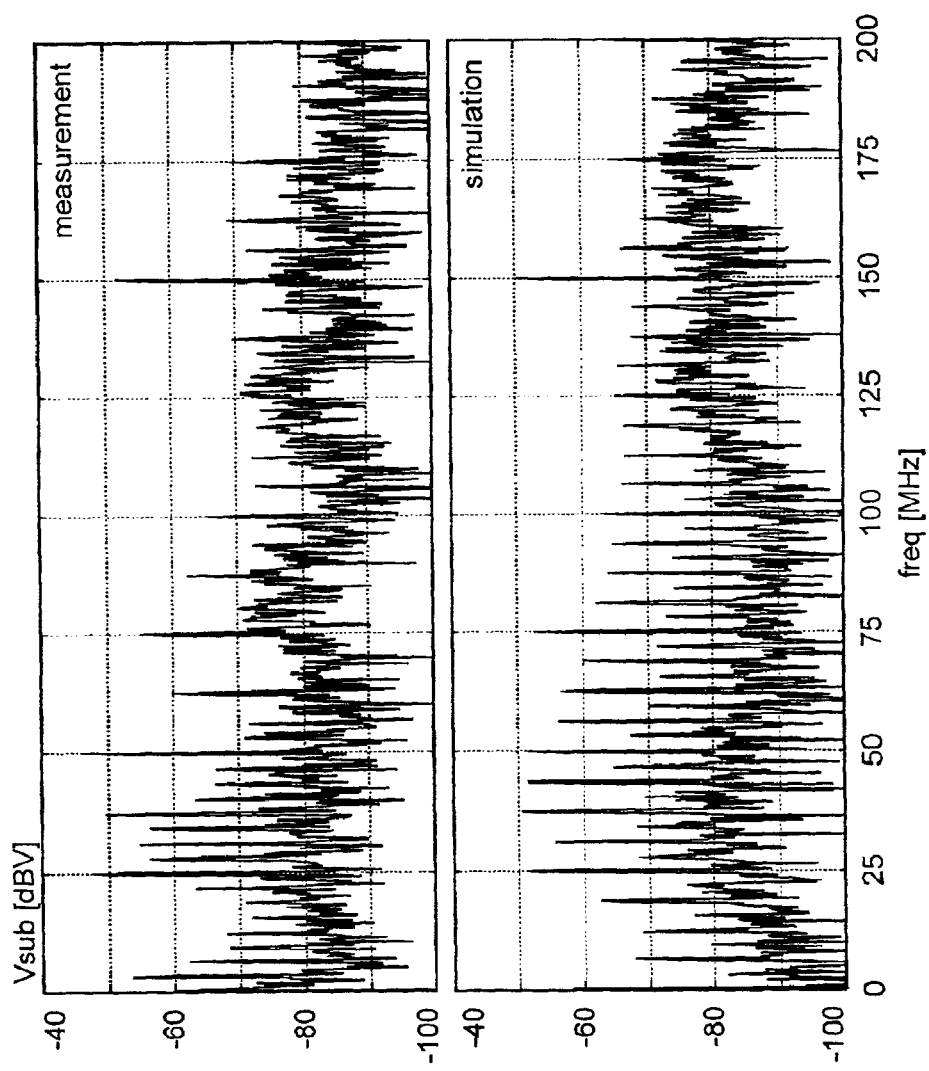
Figure 20: Frequency spectrum of measured and simulated substrate noise voltage

METHOD, APPARATUS AND COMPUTER PROGRAM PRODUCT FOR DETERMINATION OF NOISE IN MIXED SIGNAL SYSTEMS

This application claims the benefit of the U.S. Provisional Applications Ser. No. 60/190,704, filed Mar. 17, 2000 and Ser. No. 60/266,184, filed Feb. 2, 2001.

The invention relates to analysis of the noise coupling problem in mixed signal systems and more in particular to methods for determining noise in said mixed signal systems and to an apparatus implementing said methods. The methods may be implemented using a computer program product such as an executable program stored on a suitable data carrier, executable for example, on a computer system.

BACKGROUND OF THE INVENTION

The need to integrate as much functionality on one integrated circuit (IC), has led to the development of more and more mixed-signal ICs, comprising at least one digital circuit and at least one analog circuit. These ICs usually contain a large digital circuit, together with a small analog circuit. For example, an analog-to-digital converter can be integrated together with a baseband digital signal processor on a single IC.

These mixed-signal ICs require careful analysis of the interaction between the digital and analog part: the digital part will create noise particularly from switching actions and the leading and trailing edges of digital signals, which will degrade the performance of the analog circuits. A major part of this noise coupling occurs via the common substrate, e.g. a semiconductor substrate.

For small circuits this effect can be analyzed in suitable simulation programs such as SPICE, by adding resistors and capacitors to the original circuit description which models the substrate.

But for large digital circuits (with, for example, millions of transistors) SPICE can no longer be used economically to simulate the substrate noise coupling: the simulation time and memory requirement are too high. Therefore another simulation approach is needed to analyze to substrate noise coupling in large mixed-signal ICs.

Within a digital system one can distinguish gates, being small predefined digital subsystems. When a digital system is operational, said gates are switching, meaning computing an output based on an input, said computing typically being steered by a clock signal. Typically digital signals have fast leading and trailing edges. So when said digital system is operational, meaning executing its functionality, switching events of each of said gates can be recognized. A gate can have a plurality of switching events.

Electronic systems, being of analog, digital or mixed type, are formed on a substrate, typically a semi-conducting substrate, such as silicon, via a variety of processing steps. Within electronic systems one can distinguish between analog and digital systems. Due to the more frequent appearance of mixed type electronic systems wherein an analog part and a digital part can be recognized, the need for methods for analyzing the impact of one part on the other. Indeed although said parts are distinct, they are still coupled, meaning influencing each other, as they are formed on the same substrate. The impact analyzing methods are in particular very important in mixed type designs wherein the possibilities for influence limiting approaches are less easy applicable.

An important interaction between digital parts of an electronic system, the digital part further denoted the digital system, and analog parts of an electronic system, the analog part further denoted the analog system, is due to the so-called noise injected by said digital system on said substrate, and hence influencing said analog system via said substrate.

While the overall noise injected in said substrate by said digital system is operational can be measured when said digital system is designed, analysis tools needed during the design phase of a mixed electronic system with a digital subpart must be based on computations of said overall noise. Such overall noise computation can be a complete digital system simulation, wherein said digital system with each of said gates being described at transistor-level. Such transistor-level simulation however becomes extremely hard to perform for large digital systems with lots of gates.

A method to analyze the noise generation of large digital circuits is presented by E. Charbon et.al. ("Modeling Digital Substrate Noise Injection in Mixed-Signal IC's", IEEE Trans. on C.A.D. of Integrated Systems, vol 18, no.3, mar'99). The authors characterize the noise generation of single digital gates by analyzing the noise injected into the substrate by this gate (called a noise signature). This noise signature is derived by looking at the substrate current generated by the n-MOSFETs of the digital gate. It is assumed that the p-MOSFETs, which are located in an isolated n-well, do not contribute to the noise signature. The authors also assume that the shape of the noise signatures are related to the output switching activity of the digital gates. After these noise signatures have been extracted, an event-driven (digital) simulation of the circuit is performed to extract the switching events. The switching events are combined with the noise signatures to determine the total injected substrate current. The resulting voltage is not calculated. Also noise coupling from the power supply is not taken into account.

Another technique to estimate the substrate noise generation is presented by M. Nagata et.al. ("Substrate Noise Simulation Techniques for Analog-Digital Mixed LSI Design", IEICE Trans. Fundamentals, vol. E82-A, no.2, feb.'99). They use a mathematical noise signal, which is appointed to each switching event. By summing up all these signals as function of the digital switching events, the total substrate voltage is derived. This signal is however only a rough estimate and not an accurate waveform of the noise signal, as it is based on said mathematical noise signal of a predetermined or fixed shape. Gate dependency can not be accurately be modeled.

Another substrate noise simulation method, which does take noise coupling from the power supply into account, is presented by S. Mitra et.al. ("A Methodology for Rapid Estimation of Substrate-Coupled Switching Noise", IEEE 1995 Custom Integrated Circuit Conference). They assume that the noise coupling from the on-chip power supply is the dominant source of substrate noise. Noise coupling from switching source/drain nodes of MOSFETs is neglected. A commercial power estimator is used to derive the power consumption of the digital circuits. This information is used to estimate an average value for the substrate noise generation. No time waveforms of substrate voltage or noise current are calculated.

There is a need to provide an improved simulation environment for mixed signal systems which uses a reasonable amount of memory space, is reasonably quick to execute and which provides accurate results.

SUMMARY OF THE INVENTION

The invention aims at presenting methods and apparatus adapted for fast and accurate determination of noise in mixed signal systems, such systems comprising at least a digital system part and at least an analog system part. The digital system may be the dominant part. Said invention is of importance in single chip integration where signal integrity analysis is vital.

The invention can facilitate the analysis of the noise coupling problem in a mixed signal system formed in and/or on a substrate, meaning the analysis of the influence on the analog part by the digital part (coupling via said substrate), and more in particular methods for determining the (in principle) unwanted influence, in the form of signals generated by said digital part within the substrate and transported along or thorough said substrate to said analog part. Said signals can be denoted noise signals, noise contributions or noise.

An aspect of the present invention is a method for computing a signal in a substrate, said signal being generated in said substrate by the operation of a digital system, formed on and in said substrate. As said signal is in essence an unwanted by-effect of said digitals systems operation, meaning the switching of said digital systems gates, said signal can be denoted as a noise signal, a noise contribution or noise. Note that with noise is meant here any signal generated due to the operation of said digital system, having an impact via the substrate on said analog part.

In a further aspect of the invention an approach is presented wherein for each gate of said digital system and for each switching event of said gate noise contributions are gathered in circumstances wherein said single gate is the only gate switching according to that switching event, hence said gate noise contributions are denoted gate and switching event specific noise contributions. The switching events actually triggered by each of said gates while said digital system is operational, are determined or recorded. Based on said recorded switching events and said gate and switching event specific noise contributions the overall noise is then computed.

Note that said gate and switching event specific noise contributions are determined via transistor-level simulations of said gates, said simulations being less hard to perform than complete simulation of said digital system as said gate is substantially less complex than the overall digital system.

Further note that the terminology digital system and gate can be generalized to digital system and subsystem, as any part of a digital system can be called a gate. The selection of said subsystems is done based on the ease of determining the subsystems noise contribution. The larger a subsystem is, the more different switching events exist also. A further aspect of the present invention is the determining of noise level of a complete system by combining separate noise contributions of subsystems being smaller than said complete system.

A further aspect of the present invention is thus a method for computing an overall signal or a noise signal generated in a substrate by a digital system comprising a plurality of gates formed on said substrate, the noise being generated when said digital system would be operational resulting in a plurality of switching events of each of said gates, said method comprising:

for substantially each of said gates
  loading on a computer system a transistor-level model of said gate and said substrate and a lumped circuit model of said gate and said substrate; and
  determining gate and switching event specific signal contributions for each of said switching events by matching said transistor-level model and said lumped circuit model;

determining the switching events of each of said gates triggered when said digital system would be operational; and computing said overall signal
  by combining at least part of said gate and switching event specific signal contributions while exploiting said triggered switching events; and
  by applying said combined gate and switching event specific signal contributions on a combined lumped circuit model of said digital device, said combined lumped circuit model being derived from a combination of said lumped circuit models of said gates.

Alternatively the invention can be formalized as a method for computing the noise, generated in a substrate by a digital system, comprising a plurality of subsystems, formed on said substrate, while said digital system being operational, resulting in a plurality of switching events of each of said subsystems, said method comprising the steps of inputting the via transistor-level simulation determined subsystem and switching event specific noise contributions for each of said switching events of each of said subsystems, said subsystem and switching event specific noise contribution being the noise, generated in said substrate by the executing of a single switching event by a single subsystem; determining the switching events of each of said subsystems, triggered while said digital system is operational; and computing said noise, generated in said substrate by said digital system, by combining said subsystem and switching event specific noise contributions while exploiting said triggered switching events.

In an aspect of the invention the importance of using an appropriate modeling of said noise contributions is emphasized. Indeed prior-art approaches determine individual noise contributions without taking into account information of the substrate, leading to a substantial loss of accuracy. The invented method explicitly uses such substrate model by extracting said gate and switching event specific noise contributions based on a model of said substrate.

This is done by selecting a current profile selected such that the substrate voltage profile due to said gate's switching event and determined via a transistor-level simulation of a model of said gate including a substrate model approximates a lumped macro model based substrate voltage profile using said current profile. Said gate and switching event specific noise contributions are thus represented by a time varying current selected such that the time-variation of the substrate voltage due to said gate's switching event, determined via a transistor-level simulation, approximates (or matches) the time-variation of the substrate voltage determined by applying said time-varying current on a macro model, being a lumped model. Said lumped macro model has also model parameters, being gate specific, which are also determined during said current selection. Note that the degree of approximation determines the overall accuracy of the method and can for instance be set by the designer used the method.

Thus said gate and switching event specific signal contributions are determined each separately by matching a transistor-level model, being a model of a gate including a description of said substrate and a lumped circuit model of said gate, said matching producing gate specific parameters for said lumped circuit model for each gate;

It must be emphasized that a transistor-level simulation for each of said gates separately is performed, based on a transistor level model of both the gate under consideration and a substrate model. This is further denoted a model of a gate including a description of the substrate. In the extraction phase another model of said gate and substrate, being a substantial simplification, is used, more in particular a lumped circuit model of said gate and substrate together, abbreviate denoted a lumped circuit model of said gate or macro model.

In another aspect of the invention the importance of selecting the most noise contributing phenomena within the noise computation scheme is addressed. In the invention two main phenomena are selected as main noise source. A first noise contribution is due to the transistors within said gates while a second noise contribution is due to the power supply connections to said digital system. Although the invention recognized these contributions are main noise sources it must be emphasized that their modeling is substantially different as they use the substrate model differently. Recall the method of determining or selecting a time-varying current such that a transistor-level simulation based substrate voltage approximates a substrate voltage computed via a lumped circuit model wherein said time-varying current is generated. The lumped macro model of gate and substrate is a network of passive components. The transistor and power supply noise contribution are determined by injection their associated current at different places in said network.

Computing the overall signal is done by combining said gate and switching event specific signal contributions, by combining gate specific power supply signals, and applying said combined gate and switching event specific signal contributions and said combined power supply signal on a combined lumped circuit model of said digital device, based on said gate specific parameters of each of said gates.

In another aspect of the invention the issue of storage of information, more in particular the noise contributions within a searchable database, is considered. For instance it is recognized that the input transition time determines the amplitude (the maximal amplitude) and/or the pulse width (time shift) of said noise contributions. As storing for each input transition time the corresponding noise contribution is not feasible from storage point of view, the modeling of the relation or an approximate relation between said input transition time and the amplitude and pulse width is presented. With such modeling one can rely on a limited amount of stored noise contributions, in the limit one for a particular input transition time from which the other noise contributions for other input time transitions are computed. In a particular embodiment the modeling with a single parameter for describing both pulse width variations and amplitude variations is presented.

In another aspect of the invention it is recognized that some gates, for instance IO cells, has more than one power supply connection. Said power supply connections are differently connected to the substrate and have different packaging parasitics. Within the invention this is taken into account for determining noise contributions due to said power supply connections by using different substrate models for said power supply connections and by connecting a different package model to the related power supply connection.

In the invention for each gate at least two power supply connections (VDD, VSS) are foreseen. The method is also adapted for modeling more than two power supply connections. The packaging model of the package wherein said mixed signal device is encapsulated is added to said lumped macro model. The packaging model is in itself a lumped circuit model.

The present invention also includes a data carrier medium carrying one or more computer readable code segments or a computer program product for controlling a processing system to carry out a method in accordance with any of the methods of the invention. In particular the code segments may control a processing engine to:

a) determine gate and switching event specific signal contributions for each of the switching events of a gate and its associated substrate by matching said transistor-level model and said lumped circuit model;

b) determine the switching events of each of said gates triggered when said digital system would be operational; and c) compute the overall signal
   by combining at least part of said gate and switching event specific signal contributions while exploiting said triggered switching events; and
   by applying said combined gate and switching event specific signal contributions on a combined lumped circuit model of said digital device, said combined lumped circuit model being derived from a combination of said lumped circuit models of said gates.

The present invention also includes a computer system for computing the overall signal generated in a substrate by a digital system comprising a plurality of gates associated with said substrate the overall signal being generated when said digital system would be operational resulting in a plurality of switching events of at least some of said gates, said system comprising:

an input device for loading on the computer system for substantially each of said gates a transistor-level model of said gate and said substrate and a lumped circuit model of said gate and said substrate;

a processing means for determining gate and switching event specific signal contributions for each of said switching events by matching said transistor-level model and said lumped circuit model;

a processing means for determining the switching events of each of said gates triggered when said digital system would be operational; and a processing means for computing said overall signal
   by combining at least part of said gate and switching event specific signal contributions while exploiting said triggered switching events; and
   by applying said combined gate and switching event specific signal contributions on a combined lumped circuit model of said digital device, said combined lumped circuit model being derived from a combination of said lumped circuit models of said gates.

The computer system may be located at a remote site and only a description of the substrate and gate array is transmitted from a near location to the remote computer by means of a telecommunications network.

The present invention will now be described with reference to the following drawings.

BRIEF DESCRIPTION OF THE DRAWINGS

FIG. 1 is a schematic representation of a substrate noise simulation methodology in accordance with an embodiment of the present invention.

FIG. 2 is a representation of a SPICE substrate model

FIG. 3 is a schematic representation of a macro model created for each digital gate which may be used with the present invention FIG. 4 is a comparison of substrate impedance for the full SPICE model and the macro model FIG. 5 is a representation of an generated substrate noise current a for NAND gate FIG. 6 is a representation of an equivalent substrate noise simulation circuit which may be used with the present invention FIG. 7 is a simulation methodology flow in accordance with an embodiment of the present invention.

FIG. 8 (a) shows a SPICE model for an inverter and (b) Macro cell for a standard core cell which may be use with the present invention.

FIG. 9 shows a macro cell model for an IO cell which may be used with the present invention.

FIG. 10 shows substrate voltages from an IO cell for the macro cell model and SPICE model.

FIG. 11 shows an equivalent chip substrate model which may be used with the present invention.

FIG. 12 (a) shows load and (b) input transition time dependency for an NAND2 gate.

FIG. 13 shows input transition time effect on current.

FIG. 14 shows an architecture of an example illustrating the present invention, a counter "count8disp".

FIG. 15 shows a microphotograph of another example illustrating the present invention, the Robo4 chip having a specification as in the following table:

Figure 21:
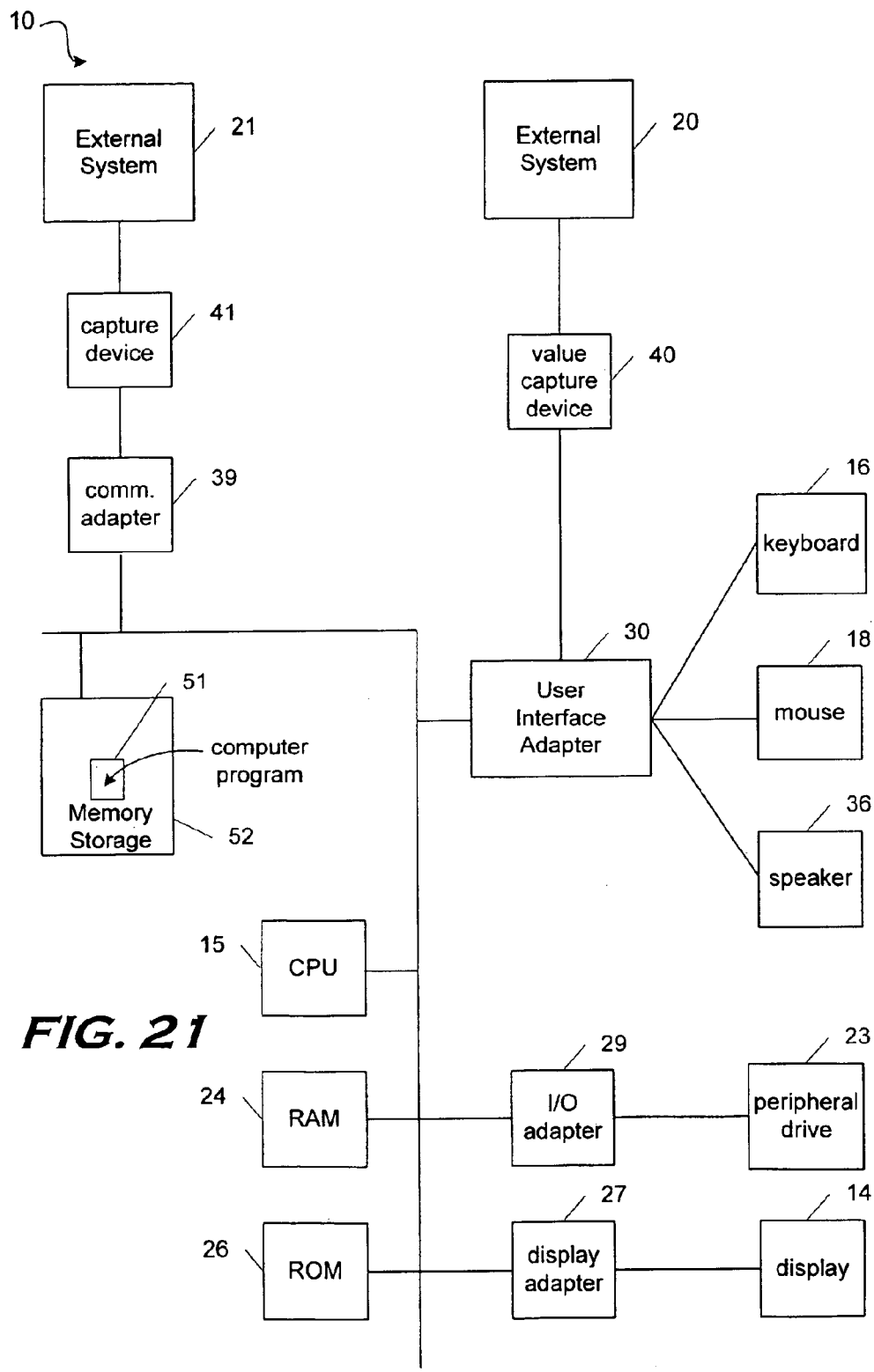

| Technology | CMOS 0.5 μm, 3.3 V |
|---|---|
| Master Clock | 163.84 MHz |
| Internal Clocks | 40.94, 20.48 and 10.24 MHz |
| IO Word | 12 bits |
| Internal Word | 14 bits |
| Gate Count | 86 k |
| Core Area | 24.22 mm2 |
| Chip Area | 38.40 mm2 |
| Package | 120 pin CPGA |
| Substrate Type | EPI (4 μm thick) |
| EPI Resistivity | 10 Ω · cm |
| Bulk Resistivity | 10 mΩ · cm |

FIG. 16 shows a schematic and transfer function of the substrate noise sensor.

FIG. 17 shows a simulation model for substrate noise calculations which may be used with the present invention.

FIG. 18 shows measured substrate noise versus clock frequency and supply voltage.

FIG. 19 shows a comparison of measured and simulated substrate noise waveforms in graphical form using the present invention which may be considered with the following table of results.

| circuit operation: 16 times upconversion from 3.125 MHz to 50 MHz master clock Fclk = 50 MHz time period = 5 μs (only 0.3 μs is shown). measurement bandwidth = 1 GHz | | | |
|---|---|---|---|
| | measurement | simulation | error |
| Vsub RMS | 13.3 mV | 12.0 mV | 9.8% |
| Vsub PP | 80.6 mV | 96.0 mV | 19% |

FIG. 20 shows a frequency spectrum of measured and simulated substrate noise voltages as determined by the present invention which may be considered with the following table of results.

| circuit operation: 16 times upconversion from 3.125 MHz to 50 MHz master clock Fclk = 50 MHz time period = 4.8 μs bandwidth = 1 GHz | | | |
|---|---|---|---|
| | measurement | simulation | error |
| Psub,tot* | −25.8 dBm | −26.8 dBm | 1 dB |
| Psub at n/16 * Fclk | −27.9 dBm | −28.9 dBm | 1 dB |
| Psub in noise floor | −30 dBm | −31 dBm | 1 dB |
| Vsub at: | measurement | simulation | error |
| Fclk | −46 dBV | −51 dBV | 5 dB |
| 2 * Fclk | −65 dBV | −63 dBV | 2 dB |
| 3 * Fclk | −52 dBV | −50 dBV | 2 dB |

*Substrate noise power (Psub) is calculated in 50 Ω only for reference

FIG. 21 is a schematic representation of a computer system which may be used with the present invention.

DETAILED DESCRIPTION OF ILLUSTRATIVE EMBODIMENTS

The present invention will be described with reference to certain embodiments and drawings but is not limited thereto but only by the claims. The invention focuses on methods for determining the noise generated by a digital circuit with at least one gate, formed on a substrate, e.g. a semiconductor substrate. Where reference is made to "gate" it should be appreciated that a grouping of gates is included within the meaning of this term. The substrate may be high-ohmic (e.g. highly resistive) or low-ohmic. In the following reference will be made to computer programs and languages such as SPICE or VHDL. These are given only as examples and the invention is not limited thereto. For instance, instead of SPICE any other suitable transistor level simulation could be used, e.g. from MatLab. Instead of VHDL another suitable register transfer level description could be used, e.g. VERILOG.

Said methods are useful for the evaluation of the effect of said generated noise on an analog circuit, formed on said substrate. This effect may also be denoted noise coupling via said substrate. The methods characterize the noise generated by single (or small groupings of) digital gates by analyzing the noise generated into the substrate by these gates (or grouping thereof). Said generated noise is also called the noise signature of a gate (or a grouping thereof). Note that said approach is also useful during the design phase of a circuit (when no layout of the final circuit is available yet).

A method is thus described for computing a signal in a substrate, said signal being generated in said substrate by the operation of a digital system, formed on and/or in said substrate. As said signal is in essence an unwanted by-effect of said digitals systems operation, meaning the switching of said digital systems gates, said signal can be denoted as a noise signal, a noise contribution or noise.

The invention is thus a method for computing the noise, generated in a substrate by a digital system, comprising a plurality of gates, formed on said substrate, while said digital system being operational, resulting in a plurality of switching events of each of said gates, said method comprising the steps of inputting the gate and switching event specific noise contributions for each of said switching events of each of said gates, said gate and switching event specific noise contribution being the noise, generated in said substrate by the executing of a single switching event by a single gate, and determined via a transistor-level simulation for each of said gates separately; determining the switching events of each of said gates, triggered while said digital system is operational; and computing said noise, generated in said substrate by said digital system, by combining said gate and switching event specific noise contributions while exploiting said triggered switching events.

It is an aspect of the invention that said noise determination methods take into account both the noise generated due to switching of said gate and the noise generated via the power supply. Therefore the invented method can be characterized as a method for determining the noise generated by a digital circuit with at least one gate, formed on a substrate, wherein both noise generated by said gates and noise generated through the power supply, is determined.

Computing the overall signal is done by combining said gate and switching event specific signal contributions, by combining gate specific power supply signals, and applying said combined gate and switching event specific signal contributions and said combined power supply signal on a combined lumped circuit model of said digital device, based on said gate specific parameters of each of said gates.

It is another aspect of the invention that said noise determination methods take into account that noise is generated both due to output and input switching of said gate. Therefore the invented method can be characterized as a method for determining the noise generated by a digital circuit with at least one gate, formed on a substrate, wherein both noise generated by input and output switching of said gates, is determined.

It is another aspect of the invention that said noise determination methods take into account the substrate current generated by both the n-MOSFETs and p-MOSFETs of the digital gates.

It is another aspect of the invention that said noise determination methods take into account the time dynamics of the noise contribution, instead of only average values. Therefore the invented method can be characterized as a method for determining the noise generated by a digital circuit with at least one gate, formed on a substrate, wherein waveforms, being time functions, of the noise generated are determined. Said generated noise can be due to switching of said gate, including both input and output switching, and power supply noise contributions. Said waveforms are determined by a simulation of a model of said gate, including a description of the substrate wherein and whereon said gate is formed. Said simulation is a transistor level type simulation, meaning that in the model the individual components, switches, transistors describing said gate are described. More detail, for instance interconnect node influences, due to interconnect not in said substrate, can be added.

It is another aspect of the invention to present fast but still accurate noise determination methods for digital systems having huge amounts of gates. A full circuit simulation approach at transistor level including noise generating aspects is not feasible for such huge systems. Therefore in the invention a noise determination method is presented, comprising the steps of (i) determining or extracting the noise contributions for each gate, being used in said digital system, separately, via a transitor level simulation (ii) determining or extracting switching events of said digital system, via a gate level simulation of said digital circuit and (iii) combining said noise contributions of said gates and said switching events in order to determine the noise generated by said digital circuit.

In another aspect of the invention said noise contribution extraction of said gate or standard cells are performed via a circuit simulation at transistor level, including substrate resistors and well capacitors, describing a substrate description. In a further embodiment thereof, said circuit simulation results are mapped onto a so-called macro model, also denoted substrate macro model or gate specific lumped circuit model. Said substrate macro model can be considered to be a low-frequency approximation of the noise dynamics of said gate or standard cell and is a mixed empiral, physical model. Said substrate macro model includes at least two noise current sources. A first noise current source represents the switching noise, both input and output switching activity, of said gate while a second noise current source represent power supply noise current generation. Said substrate macro model further comprises the resistance between the power supply ground and substrate, the junction capacitance, and the circuit capacitance. Said substrate macro model also includes a node for modeling the substrate noise voltage. In a further embodiment said switching noise current source is determined such that the substrate noise voltage matches with the transistor level circuit simulation value of the substrate voltage. The power supply noise current is possibly determined by measuring the current flowing through the supply voltage source. The circuit capacitance can be determined by performed transistor level simulation of the gate without the substrate model, typically a small signal AC simulation is used therefore.

The method for computing the noise, generated in a substrate by a digital system, extracts said gate and switching event specific noise contributions being based on both a detailed and simplified model of said gate and said substrate, said detailed model being a transistor level model including a substrate description, said simplified model being a lumped circuit model. The gate and switching event specific noise contributions are represented by a current profile selected such that the substrate voltage profile due to said gate's switching event determined by detailed simulation approximates said simplified substrate and gate model based substrate voltage profile using said current profile. Thus said gate and switching event specific noise contributions are represented by a time-varying current selected such that the time-variation of the substrate voltage due to said gate's switching event, determined via a transistor-level simulation using a first gate-substrate model incorporating a detailed substrate model, approximates the time-variation of the substrate voltage determined by applying said time-varying current on a simplified model of said gate and substrate.

In another aspect of the invention said combining said noise contributions of said gates and said switching events in order to determine the noise generated by said digital circuit comprises of combining said substrate macro models of said gates into a single equivalent substrate macro model for said digital system, also denoted a combined lumped circuit model. Thereore said substrate macro model are typically chosen to be equal for each digital gate. This is however not a strict requirement. An easy combineability of these substrate macro model is however an advantage. Further said noise currents, both substrate noise and power supply noise waveforms, are added, thereby using the switching events. Optionally an extra series resistance can be added to the circuit capacitance in order to model damping and also optionally a inductance can be added in series.

Said gate and switching event specific contribution extraction also generates model parameters of a simplified gate-substrate model. The determining of said overall substrate voltage due to operation of said digital system is performing the steps of combining current profiles, combining said model parameters and applying said combined current profiles on a simplified substrate model with combined model parameters.

In another aspect of the invention, said combining of said substrate macro models is adapted in order to be capable of dealing with a high-ohmic substrate. Instead of a simple combining, meaning that said substrate models of said gates have a common substrate voltage node, said gates have a separate node, being combined via a mesh of resistors, said mesh models said high-ohmic substrate.

In another aspect of the invention it is recognized that transistor level simulation can be performed for groups of gates. Grouping however increases the complexity as more switching possibilities must be considered. On the other hand the combining of the resulting noise signatures based on the gate level simulation is made more easier. The invention is such that this trade-off can be exploited. It must however be emphasized that grouping of digital gate or more in general defining for which components separate transistor level will be performed in more than only this trade-off. Indeed grouping or using an other definition leads also to another transistor level simulation, in the sense that geometric information, meaning the locations of the individual transistors in the substrate, is taken into account. Certainly in the case of a high-ohmic substrate, grouping or exploiting other definitions is thus also a matter of accuracy.

It must be noted that the invented approach of separate simulation of noise of a digital gate (or a grouping thereof) at transistor level and combining the resulting noise signatures with gate level simulation enables fast but still accurate noise determination as the main difficulty of noise determination methods is taking into account delays. The selected simulation levels deliver the required delay information, which is problematic in higher level approaches. It is another aspect of the invention to present an apparatus being adapted for implementing the above mentioned noise determination methods. Said apparatus comprises of a transistor level simulator and a gate level simulator. Said gate level simulator is adapted such that easily switching events can be extracted. Said transistor level simulator is adapted such that it can cope with transistor model extended with a substrate model.

A further extension to the simulation of substrate noise generation at gate-level is the inclusion of a substrate noise macro model for IO buffers, being of importance because switching-noise from IO buffers can contribute up to 30% of the total noise generation. Modeling of IO cells is presented.

Yet another further extension to the invention is to include multiple supply domains, which is both important for accurate simulation of the noise generation (especially because ringing on each supply will couple to the substrate) and for analyzing which supply domain is causing most substrate noise in large complex digital circuits with multiple supplies. An extraction methodology of an equivalent substrate model within multiple supply domains is presented.

Yet another further extension to the invention is to include output load and input transition time dependency and to present modeling of input transition time and load dependencies.

1 Substrate Noise Simulation Methodology

A high-level simulation methodology for substrate noise generation preferably consists of two parts: a one-time characterization of all digital standard cells to extract the substrate current generation for every possible switching combination and a gate level simulation, e.g. a VHDL gate level simulation (with an extended VHDL gate library), for each design to extract the switching events. From these switching events the total generated substrate noise is calculated. This methodology is schematically shown in FIG. 1.

The characterization of a standard cell library, shown above the dotted line in the figure, consists of creating detailed substrate models for each standard cell and extracting the generated switching noise and power current waveforms for all possible switching combinations. These currents, together with a reduced substrate model for the gate, are combined in a macro model. Finally all macro models are collected in a single library. The standard cell library is also preferably extended to include switching event extraction routines.

Using the extended VHDL gate library a normal VHDL gate level simulation is performed for a given design. During the simulation all switching events are recorded and collected in a switching event file.

Finally the macro models are combined together using the switching event data. The resulting equivalent substrate model for the entire digital circuit is used to simulate the total generated substrate voltage noise. The next two sections describe this methodology in more detail.

Alternatively, the simulation methodology can be described as follows: for each core cell and IO cell in the standard cell library, a substrate macro model containing supply current sources and a switching noise (noise through the bulk node) current source for each possible input and state combination, taking input transition time and the load dependency into account, is developed. This standard cell characterization is performed once for every technology. The results are stored in a SUBMACRO library, which contains the substrate model of each cell. Next, a gate-level simulation of the digital system is performed to store all the switching activities using the SWITCHVHDL library. Then the equivalent substrate model of the total digital system at chip level considering multiple supply domains with their corresponding package parasitics is extracted. With this equivalent model, the total substrate voltage is computed. An overview of this simulation methodology is shown in FIG. 7. The resulting substrate noise source can then be connected to the substrate node of a sensitive circuit to see the impact of the noise.

2 Macro Model Library Extraction 2.1 SPICE Substrate Modeling

Switching MOSFETs generate substrate currents via two mechanisms: capacitive coupling from source, drain and gate to substrate and impact ionization. Most substrate current is produced by capacitive coupling from drain and source junctions and, depending on the technology, impact ionization. In our SPICE simulations we use the BSIM3v3 MOSFET model, which includes both capacitive coupling and impact ionization.

To simulate the amount of substrate noise generated by a digital gate, a model of the substrate is included in the simulation. The substrate may be modeled using any suitable simulation model such as SPICE, e.g. by adding substrate resistors and well capacitors to the original SPICE circuits of the digital gates. FIG. 2 shows this model for the example of a CMOS inverter.

Either low-ohmic (typically 10 mΩcm) or high ohmic substrates may be considered. Particularly for low-ohmic substrates, the entire substrate can be approximated by one electrical node. The resistor and capacitor values can be calculated using simple empirical expressions, taking into account geometry information of MOSFETs, wells and substrate taps. This model is used as a reference to calculate the accuracy of the high-level simulations. The validity of this model is preferably verified with measurements. More detailed substrate models can be created particularly for high-ohmic substrates and RF applications. For instance, with respect to the combined lump circuit model, an impedance mesh can be used instead of one node, e.g. a resistor mesh or a resistor and capacitance mesh. In particular, where the frequency is high, it is useful to use a capacitance and resistance mesh. With the expected increase in computing power and speed in the future other more complex tools can be used to extract very accurate substrate models and are included within the scope of the present invention.

2.2 Substrate Macro Model

For each gate a substrate macro model is created. A model of this type is shown in FIG. 3 and contains all elements necessary to simulate substrate noise. It is derived from the SPICE substrate model. The resistance Rsub is determined by the resistance between the supply voltage Vss and substrate, Cwell is the junction capacitance between the supply voltage Vdd and the substrate and Ccir is the circuit capacitance between the supply voltages Vdd and Vss. Source Inoise models the substrate current injection from switching nodes and source Ipower models the power supply current consumption.

This macro model is a low-frequency approximation, valid up to several GHz, of a full SPICE substrate model. When the impedance between substrate and ground is examined using the full SPICE model, a resistor in parallel with the well capacitor with a series resistor can be identified. In the macro model the series resistance of the well capacitor can be neglected. FIG. 4 shows the influence of this approximation on the impedance of substrate to ground.

The noise current source (generating the substrate voltage due to noise coupling from the MOSFETs) may be created in such a way that the generated substrate voltage is the same or similar to within a certain predefined level or error for the macro model and the full SPICE model.

2.3 Noise Current Extraction

Noise coupling from switching MOSFETs is not only caused when the output of a digital gate switches, but also input transitions that do not cause output transitions will cause substrate noise. In FIG. 5 this is illustrated for a NAND gate.

The rising edge of input A causes a substrate current that is as large as the current caused by a changing output. Also for flip-flops it is important to take noise coupling from switching inputs into account: negative clock edges (for a positive edge triggered flip-flop) and changes on the data input do not directly cause an output transition but will cause substrate noise and these input transitions occur constantly.

To extract the waveform for the current source Inoise, shown in FIG. 3, a SPICE simulation is performed for the digital cell with the detailed substrate model. A digital input pattern is applied to the gate that covers all switching combinations and the resulting substrate voltage is recorded. This voltage is then imposed on the substrate node of the macro model using a voltage controlled voltage source. By measuring the current flowing through this source the waveform for Inoise is obtained. This waveform is recorded for each switching action for a period of 2ns and a time step of 10 ps.

2.4 Power Supply Current Extraction

Apart from substrate noise caused by switching MOSFETs there is another important noise source: noise coupling from the digital power supply. This power supply will contain or will generate switching noise and can show oscillations (ringing or ground bounce). Since in each digital gate the ground is connected to the substrate via Rsub, the total resistance from ground to substrate can be very low (less than 1 Ω for large digital circuits). So all noise and ringing on the digital ground is directly coupled to the substrate and this noise source can easily dominate the total substrate noise generation. To include noise coupling from the power supply in the methodology in accordance with the present invention, the current source Ipower has been added to the macro model of FIG. 3. The waveform of this current source is extracted during the simulation of the noise currents by measuring the current flowing through the supply voltage source.

To accurately simulate noise coupling from the power supply, the ringing effects should also be included in the macro model. This requires that the circuit capacitance Ccir between power and ground is extracted for each cell and added to the macro model. This extraction is performed by a small signal (AC) simulation of the digital gate without the substrate model.

2.5 VHDL Library Extension

Finally the VHDL standard cell library has to be extended to enable the detection of all input switching events. This library is created by adding switching event detection processes to the original VHDL library. When the cells from this library are invoked during a gate-level simulation, all input transitions are recorded together with the time of occurrence, the cell type, instance name and state of the other inputs and outputs. For each standard cell, an input can take a state value of logic-1, logic-0, rising edge, or falling edge. So the total number of input transition states for a standard cell is 4n, with n is the number of the inputs.

The VHDL standard cell library can be chosen to be an industry standard such as a VITAL VHDL library. The extension procedure of VITAL VHDL models of each standard cell enables porting the back-annotation delays extracted from the layout or wire load models. This delay information is often crucial for accurate extraction of the switching activities during the simulation.

The switching event detection process constructed for each standard cell has an activity time window to disregard signals whose pulse width is less than this activity time window. For each standard cell, this window size is characterized based on the experimentation of the minimum pulse width requirement for a current waveform generation after SPICE simulations.

3 Substrate Noise Simulation

To simulate the total generated substrate noise for a given circuit, first a normal gate-level (e.g. VHDL) simulation is performed, for instance, using the special VHDL switching event detection library. During this simulation an output file is created that contains a list of all switching events. Next the macro models for all individual gates in the design are combined together. For high-ohmic substrates the macro models can be combined together in small groups taking floorplanning information into account. These groups of macro models can be combined together by connecting the substrate nodes to a substrate resistor mesh. Also power routing parasitics can be added between the groups of macro models. For low-ohmic substrates this resistor mesh can be approximated by one electrical node and all macro models can be connected in parallel. This results in one equivalent substrate noise simulation model as shown in FIG. 6.

The element values of this model are calculated using the following expressions:

$$\frac{1}{R_{sub,tot}} = \sum_{all\ gates} \frac{1}{R_{sub,gate}}$$

$$C_{well,tot} = \sum_{all\ gates} C_{well,gate}$$

$$C_{cir,tot} = \sum_{all\ gates} C_{cir,gate}$$

The waveforms of the noise current and power supply current in the total substrate model are calculated by accumulating all individual waveforms belonging to the switching events:

$$I_{noise,tot}(t) = \sum_{all\ switching\ events} I_{noise,event}(t - t_{event})$$

$$I_{power,tot}(t) = \sum_{all\ switching\ events} I_{power,event}(t - t_{event})$$

Finally, inductances in the power supply connections are added. A DC voltage source can be included to set the correct operating point (e.g., set Vdd to 3.3 Volt). Also an extra series resistance is added to the circuit capacitance to achieve to correct amount of damping of the power supply ringing. It has been observed that this resistor was only needed for the small test circuits. For larger circuits this resistance is negligible.

The substrate noise simulation model of FIG. 6, together with the calculated current waveforms Inoise,tot and Ipower, tot, can be simulated with a circuit simulator like SPICE. Depending on the inductance value the simulation can be performed with or without (Lb =0 nH) power supply noise. Also the effect of different inductance values (wirebond versus flip-chip) and extra decoupling capacitance on substrate and power supply noise can be simulated.

The resulting substrate voltage can also be calculated by representing the simulation model of 6 in the s-domain, where Ipower,tot and Inoise,tot are the inputs and the output is the substrate noise voltage. This s-domain transfer function is transformed into z-domain through a bilinear transformation. The resulting z-domain expression is an IIR-type digital filter in which the circuit is now represented by difference equations. The substrate noise waveform transients are obtained by the simulation of this IIR-type equivalent network.

4 EXAMPLE

As an example a substrate model for an inverter is shown in FIG. 8-*a*. The substrate types considered here are low-ohmic substrates (bulk resistivity of 10 mΩcm), which have a better latch-up immunity when compared with high-ohmic substrates. For low-ohmic substrates, a single electrical node can approximate the entire substrate. The horizontal resistances between the standard-cells are larger than vertical resistances along the p-epi layer as the thickness of the p-epi layer is small (~4 μm). Therefore, every standard cell is represented in a π-circuit model, which simplifies the model reduction at chip level, and horizontal resistive paths between standard cells are neglected. The element values are calculated using empirical formulas, taking into account geometry information of the substrate contacts and nwells in a known manner. The macro cell models (also for a cell with multiple supplies) contain two types of current sources: one, which models the coupling from the switching MOSFETs (Ibulk), and two sources, which model the power supply current (Ivss, Ivdd). The current generated by the switching gate is generated into the substrate and flows back to the AC ground via the substrate. The impedance between the AC ground and the substrate can be modeled by a parallel combination of a resistance and a series connection of a capacitance and a resistance. The macro cell model is shown in FIG. 8-*b*. The current source waveforms in this model are derived in such a way that the macro cell model produce the same substrate voltage as the transistor-level model shown in FIG. 8-*a*. This is a good approximation up to several GHz.

5 Modeling of IO cells

Experimental results have shown that switching IO buffers contribute up to 30% of the total substrate noise power generation. A typical IO cell has two power supplies. One (vdde, vsse) is used for the last output stage of cascaded buffers while the other supply (vdd, vss) is used for the remaining buffers and circuitry. Such a separation in the supplies is necessary as the last output stage of the IO cell is usually noisy and the ground of this supply (vsse) is not connected to the substrate, whereas the core supply ground (vss) is mostly connected to the substrate. For the cells, which have multiple supplies, circuit capacitances are extracted between different supply pairs so that the coupling between the supply domains is included in the model. This is equivalent to an impedance matrix extraction for an N-port device. The rest of the parameters are computed in a similar way as for a standard core cell with a single power supply. In FIG. 9, an example is shown of the macro model of an IO cell with multiple supplies. Notice the presence of capacitor Csub2 because the ground is not connected to the substrate for the vdde-vsse supply domain. The validity of the IO macro cell model has been verified and compared to a full SPICE simulation of the extracted netlist of the IO cell as depicted in FIG. 10.

6 Equivalent System Substrate Model for Multiple Supply Domains

Generation of an equivalent system substrate model is necessary for the substrate noise simulation with the extracted switching activities. The macro cell models are combined together within their corresponding supply domain, as the substrate node is common for each macro cell model on epi-type substrates. Following expressions are used for model reduction of a network in supply domain i:

$$Rsub(i) = \left( \sum_{\substack{j=all\ gates \\ within\ domain-i}} \frac{1}{Rsub(i,j)} \right)^{-1}$$

$$Cwell(i),\ cir(i) = \sum_{\substack{j=all\ gates \\ within\ domain-i}} Cwell(i,j),\ cir(i,j)$$

$$Ibulk(i,t) = \sum_{\substack{j=switching\ events \\ within\ domain-i}} (t - \beta \cdot t[i,j]) \times \frac{1}{\beta}$$

$$Ipower(i,t) = \sum_{\substack{j=switching\ events \\ within\ domain-i}} Ipower(t - \beta \cdot t[i,j]) \times \frac{1}{\beta}$$

In the above expressions, β is a factor used for the time and the amplitude scaling, which models input transition time dependency of the current waveform for the macro cell model (see further). After the model reduction of the cells, package parasitics are attached to each supply domain. An example of a chip with three supplies is shown in FIG. 11. The chip consists of core cells grouped into two supply domains and IO cells with two supplies, where one of the supplies is a core supply and the other one is an additional supply specific for IO cells (vdde, vsse). The network itself with all lumped elements and independent current sources is represented as an s-domain transfer function with multiple inputs. This transfer function is then transformed into a z-domain transfer function to perform the simulation with difference equations to increase the simulation speed. The supply currents and the bulk current in the SUBMACRO library are generated for any input switching activity. However, as will be discussed further, input transition time and load have an impact on those currents.

7 Modeling of Input Transition Time and The Load on Macro Cell Models

The load as well as the input transition (rise and fall) time can have an important influence on currents flowing within a gate, supply rails and the load itself during the switching event. For an accurate simulation of the substrate noise, it is therefore important to model the input transition time and the load within the macro cell models. In the VHDL simulation all input switching activity is recorded, also for the inputs that do not cause output switching. However, the load dependency of the supply currents and the bulk current becomes important, only when the output is switching. An example of load dependency for a NAND2 gate is shown in FIG. 12-$a$. As the load increases, the supply current pulse width of the macro cell model increases without a change in the amplitude. For the bulk current, the effect is seen as a decrease in the amplitude without a change in the pulse width. On the other hand, input transition time dependency is always important, whether the output is switching or not. The pulse width of the current waveforms increases and the amplitude decreases with an increase in the input transition time. An example is shown for the input transition time dependency for an NAND2 gate in FIG. 12-$b$. The SUBMACRO library is implemented as a look-up table, which contains the waveforms for combinations of load values (Cl) and different switching activity types (Swi). Those waveforms are extracted for a given constant input transition time. When a switching activity occurs for a gate with a different input transition time, the amplitude and the pulse width of the waveform are modified. This modification of the waveform is shown in FIG. 13.

The change in the pulse width and the amplitude of the waveform due to the input transition time is as follows:

$$\Delta ti = \Delta tref + \text{Itt\_i} - \text{Itt\_0} \quad Ai = Aref \times \frac{\Delta tref}{\Delta ti}$$

$$\beta = \frac{\Delta ti}{\Delta tref} : \text{Amplitude-time scaling factor}$$

Using the $\beta$ factor, the expansion/compaction in time and decrease/increase in the amplitude are computed after the current waveform is fetched from the look-up table with its corresponding load and switching activity type. Because of load and input transition time dependency and multiple supply regions, additional attributes are necessary for each instance in the switching activity file generated by the gate-level VHDL simulation. These are load, input transition time, supply domain, switching activity type, gate type, time of switching, and a flag indicating an output switching. The input transition time for each port and the loads are computed with the use of the fanout and the net loads from backannotation.

8 Experimental Results

In this section, the comparison between high-level method and SPICE simulations will be shown for a test circuit, count8disp (8-bit counter with a 7-segment display). This circuit, shown in FIG. 14, is simulated for 20 clock cycles using two experiment groups (A and B). Each of the high-level simulations within a group is compared with the corresponding full SPICE level simulation used as a reference such that A-n and B-n is compared with A-ref and B-ref respectively. For each scenario within a group, simulation time, RMS value and maximum peak-to-peak value of the substrate voltage are recorded to derive accuracy and the speedup figures (see Table 1).

TABLE 1

Results for count8disp

| Test | Description |
|---|---|
| A-ref | SPICE simulation of the circuit in the FIG. (without IO pad). |
| A-1 | Gate-level approach (without no extensions) |
| A-2 | Gate-level approach + inp. trans. time/load |
| A-3 | Gate-level approach + multiple supplies |
| A-4 | Gate-level approach + multiple supplies + inp. trans. time/load |
| B-ref | SPICE simulation of the circuit in the FIG. (with IO pad). |
| B-1 | Gate-level simulations + multiple supplies + inp. trans. |

| | time/load + IO model | | | | |
|---|---|---|---|---|---|
| Test | Vsub,RMS [mV] | Vsub,Pmax [mV] | ErrRMS [%] | ErrPPm [%] | SimTime [s] |
| A-ref | 4.852 | 87.70 | 0 | 0 | 3572 |
| A-1 | 3.525 | 56.62 | 27.3 | 35.4 | 27 |
| A-2 | 4.006 | 79.42 | 17.4 | 9.4 | 30 |
| A-3 | 3.858 | 54.54 | 20.5 | 26.4 | 38 |
| A-4 | 4.554 | 93.48 | 6.1 | 6.1 | 48 |
| B-ref | 6.922 | 103.18 | 0 | 0 | 14940 |
| B-1 | 7.361 | 119.88 | 6.3 | 16.2 | 70 |

For experiment group-A, the comparison shows that the accuracy increases whenever the extensions such as input transition time, load dependency, and multiple supply domains are added into the invented simulation methodology. The error in the RMS substrate voltage is reduced from 27.3% to 17.4% when only the load and input transition time dependency are included. Multiple power domains are preferably not neglected since each power domain has its own specific ringing frequency, which is visible in the generated substrate noise spectrum. The overall combination of load and input transition time dependency together with multiple supplies gives the maximum accuracy. For experiment group-B, a single output pad is added into the circuitry in order to make a comparison between the invented gate level simulation with all the extensions and the full SPICE simulation (see Table 1). The comparison between A-ref and B-ref shows that the IO pad is responsible for 30% of the total substrate noise power generation. Table 2 summarizes the simulation details and times for count8disp together with two other examples, mult8 (8-bit multiplier circuit) and Robo4 (multi-rate channel selection filter). For larger circuits, the speedup with respect to full SPICE level simulations becomes higher. For very complex digital circuit, like the 80Kgate circuit Robo4, SPICE simulations are no longer feasible.

TABLE 2

Results for the test circuits

|  | Count8disp | Mult8* | Robo4* |
|---|---|---|---|
| Core gate equiv. area | 278 | 994 | 81298 |
| Total gate equiv. area | 728 | 994 | 89132 |
| Clock Period/Cycles | 10 ns/20 | 25 ns/200 | 20 ns/50 |
| # Switching Activities | 5056 | 63106 | 76205 |
| Model Extract Time | 0.10 sec | 0.13 sec | 6.02 sec |
| SPICE Sim. Time | 14940 sec | 37 hours | — |
| VHDL Sim. Time | 38.64 sec | 30.12 sec | 11:43 min |
| Substrate Sim. Time | 31.29 sec | 18.67 sec | 41.14 sec |
| High-Level Sim. Time | 69.93 sec | 48.79 sec | 12:24 min |
| Speed-Up | ×213 | ×2730 | — |

*simulation without load and input transition time dependency

9 More experimental results

A test chip consisting of an 86Kgate digital circuit and analog substrate noise sensors to measure the substrate noise voltage. The digital circuit is a multi-rate up/down converter and channel select filter for cable modem applications. This chip can up-convert or down-convert 12 bit I/Q data by a factor of 16 and perform channel selection. FIG. 15 shows the microphotograph and specifications of this chip and also the location of the analog substrate noise sensors. The schematic and measured and simulated transfer function of these sensors are shown in FIG. 16 The sensors amplify the substrate voltage by 3 dB in the frequency band from 20 kHz to 1 GHz.

The model, used for the substrate noise simulations, is shown in FIG. 17. It includes noise generation from core cells, IO cells, power supply pads and package parasitics. Macro models of the core cells, IO cells and supply pads take into account the impedance between the power supply and substrate nodes. The low-ohmic substrate is modeled as a single node and all core and IO cell models are placed in parallel. FIG. 17 shows the element values for the parallel combination of all core and IO cell models. Macro models are extracted once for an entire standard-cell library with SPICE simulations that include a detailed substrate model. Substrate noise generation is modeled by current sources that represent noise injection by switching gates (Isub,core and Isub,IO) and power supply current consumption (Ivdd, Ivss, Ivdde and Ivsse), calculated from switching events that are extracted from a VHDL gate-level simulation.

Since the package parasitics, such as bondwire, trace and pin inductance and resistance, determine for a large part the amount of substrate noise generation, it is important to determine accurate values for these parasitics. For the 120 pin ceramic Pin Grid Array package an average value of 12 nH in series with 1.5 ohm has been measured for one connection. The parasitic inductance in the power supply, which consists of 8 parallel connections, in combination with the total on-chip capacitance between power and ground (around 3.5 nF), causes ringing at a frequency of approximately 40 MHz. This ringing also couples to the substrate and causes a 20 dB increase of substrate noise around that frequency.

Measurement of the RMS substrate noise voltage versus clock frequency and supply voltage, shown in FIG. 18, shows that it scales with the square root of the clock frequency and linearly with the supply voltage. This means that the substrate noise power scales in the same way, and is closely related to, the dynamic power consumption. The measured time waveform of the substrate noise voltage and the frequency spectrum of this signal are shown in FIGS. 19 and 20. For this specific circuit operation the RMS substrate noise voltage is 13.3 mV. The largest substrate noise peak in the frequency spectrum is −46 dBV (50. mV) and is generated at the master clock frequency (50 MHz). 62% of the total substrate noise power is generated at multiples of the lowest clock frequency (3.125 MHz).

Simulation results of the substrate noise generation are also shown in FIGS. 19 and 20 and are compared with the measurements. The difference between measured and simulated RMS substrate voltage is less than 10%. From the simulations it can be determined that, for this circuit operation with data output at 50 MHz, only 18% of the total noise power is generated by the switching IO buffers. For down-conversion, with data output at 1.56 MHz, this is only 7%. This means that most substrate noise is generated by simultaneous switching activity of core cells (mainly flip-flops), which therefore needs to be carefully modeled. Table 3 gives an overview of the simulation times for this circuit and for a smaller example. The substrate noise simulation time for this circuit is about the same as the VHDL gate-level simulation time. Comparison with a full SPICE simulation of the digital circuit with its substrate model is not feasible due to the circuit size. For a 1 Kgate circuit the speedup with respect to a full SPICE simulation is more than 1500 times.

TABLE 3

Overview of simulation times

|  | Robo4 86 Kgates | multiplier 994 gates |
|---|---|---|
| Simulated time | 1 μs | 5 μs |
| No. switching events | 150000 | 63500 |
| Clock frequency | 50 MHz | 42 MHz |
| Full SPICE-level simulation | — | 37 hours |
| VHDL gate-level simulation | 11:27 min | 29 sec |
| Substrate noise simulation | 12:30 min | 55 sec |
| Speedup | — | 1586× |

The present invention may be implemented on a computing device e.g. a personal computer or a work station which has an input device for loading the details of the substrate and gate arrays as well as any other parameters required by the various models defined above in the description and in the claims. The computing device is adapted to run software which carries out any of the methods in accordance with the present invention. The computer may be a server which is connected to a data communications transmission means such as the Internet, a Local Area Network or a Wide Area Network. A script file including the details of the gate array and substrate(s) may be sent from one near location, e.g. terminal, to a remote, i.e. second location, at which the server resides. The server receives this data and outputs back along the communications line useful data to the near terminal, e.g. a noise level information in graphical or alphanumeric form.

FIG. 21 is a schematic representation of a computing system which can be utilized in accordance with the methods and systems of the present invention. A computer 10 is depicted which may include a video display terminal 14, a data input means such as a keyboard 16, and a graphic user interface indicating means or pointer such as a mouse 18. Computer 10 may be implemented as a general purpose computer.

Computer 10 includes a Central Processing Unit ("CPU") 15, such as a conventional microprocessor of which a Pentium III processor supplied by Intel Corp. USA is only an example, and a number of other units interconnected via system bus 22. The computer 10 includes at least one memory. Memory may include any of a variety of data storage devices known to the skilled person such as random-access memory ("RAM"), read-only memory ("ROM"), non-volatile read/write memory such as a hard disc as known to the skilled person. For example, computer 10 may further include random-access memory ("RAM") 24, read-only memory ("ROM") 26, as well as an optional display adapter 27 for connecting system bus 22 to an optional video display terminal 14, and an optional input/output (I/O) adapter 29 for connecting peripheral devices (e.g., disk and tape drives 23) to system bus 22. Video display terminal 14 can be the visual output of computer 10, which can be any suitable display device such as a CRT-based video display well-known in the art of computer hardware. However, with a portable or notebook-based computer, video display terminal 14 can be replaced with a LCD-based or a gas plasma-based flat-panel display. Computer 10 further includes user interface adapter 30 for connecting a keyboard 16, mouse 18, optional speaker 36, as well as allowing optional physical value inputs from physical value capture devices 40 of an external system 20. The devices 40 may be any suitable equipment for capturing physical parameters of the substrate and gate array and/or parameters of the various models required in the execution of the present invention. These capture devices may also include measurement devices for measuring responses of the gate array or parts thereof. Additional or alternative devices 41 for capturing physical parameters of an additional or alternative external system 21 may also connected to bus 22 via a communication adapter 39 connecting computer 10 to a data network such as the Internet, an Intranet a Local or Wide Area network (LAN or WAN) or a CAN. The term "physical value capture device" includes devices which provide values of parameters of a system, e.g. they may be an information network or databases including libraries of gate arrays and their associated parameters.

Computer 10 also includes a graphical user interface that resides within a machine-readable media to direct the operation of computer 10. Any suitable machine-readable media may retain the graphical user interface, such as a random access memory (RAM) 24, a read-only memory (ROM) 26, a magnetic diskette, magnetic tape, or optical disk (the last three being located in disk and tape drives 23). Any suitable operating system and associated graphical user interface (e.g., Microsoft Windows) may direct CPU 15. In addition, computer 10 includes a control program 51 which resides within computer memory storage 52. Control program 51 contains instructions that when executed on CPU 15 carries out the operations described with respect to the methods of the present invention as described above. The instructions may be obtained by writing a computer program in a suitable language such as C or C++ for execution of any of the methods in accordance with the present invention and then compliling the program so that it executes on a computer.

Those skilled in the art will appreciate that the hardware represented in FIG. 21 may vary for specific applications. For example, other peripheral devices such as optical disk media, audio adapters, or chip programming devices, such as PAL or EPROM programming devices well-known in the art of computer hardware, and the like may be utilized in addition to or in place of the hardware already described.

In the example depicted in FIG. 21, a computer program product (i.e. control program 51 for executing methods in accordance with the present invention comprising instruction means in accordance with the present invention) can reside in computer storage 52. The instructions (e.g., computer readable code segments in storage 52) may be read from storage into RAM 24. Execution of sequences of instructions contained in the RAM 24 causes CPU 15 to perform the process steps described herein. In alternative embodiments, hard-wired circuitry may be used in place of or in combination with software instructions to implement the invention. Thus, embodiments of the invention are not limited to any specific combination of hardware circuitry and software. Accordingly, the present invention may take the form of an entirely hardware embodiment, an entirely software embodiment or an embodiment combining software and hardware aspects.

Furthermore, the present invention may take the form of a data carrier medium (e.g. a computer program product on a computer-readable storage medium) carrying computer-readable program code segments embodied in the medium. The terms "carrier medium" and "computer-readable medium" as used herein refer to any medium that participates in providing instructions to a processor such as CPU 15 for execution. Such a medium may take many forms, including but not limited to, non-volatile media, volatile media, and transmission media. Non-volatile media includes, for example, optical or magnetic disks, such as a storage device which is part of mass storage. Volatile media includes dynamic memory such as RAM 136. Transmission media include coaxial cables, copper wire and fiber optics, including the wires that comprise a bus within a computer, such as bus 22. Transmission media can also take the form of acoustic or light waves, such as those generated during radio wave and infra-red data communications.

Common forms of computer-readable media include, for example a floppy disk, a flexible disk, a hard disk, magnetic tape, or any other magnetic medium, a CD-ROM, any other optical medium, punch cards, paper tapes, any other physical medium with patterns of holes, a RAM, a PROM, an EPROM, a FLASH-EPROM, any other memory chip or cartridge, a carrier wave as described hereafter, or any other medium from which a computer can read.

These various forms of computer readable media may be involved in carrying one or more sequences of one or more instructions to processor 15 for execution. For example, the instructions may initially be carried on a magnetic disk of a remote computer. The remote computer can load the instructions into its dynamic memory and send the instructions over a telephone line using a modem. A modem local to the computer system can receive the data on the telephone line and use an infrared transmitter to convert the data to an infra-red signal. An infra-red detector coupled to a bus can receive the data carried in the infra-red signal and place the data on the bus. The bus carries data to main memory, from which a processor retrieves and executes the instructions. The instructions received by main memory may optionally be stored on a storage device either before or after execution by a processor. The instructions can also be transmitted via a carrier wave in a network, such as a LAN, a WAN, or the Internet.

However, it is important that while the present invention has been, and will continue to be, that those skilled in the art will appreciate that the methods of the present invention are capable of being distributed as a program product in a variety of forms, and that the present invention applies equally regardless of the particular type of signal bearing media used to actually carry out the distribution. Examples of computer readable signal bearing media include: recordable type media such as floppy disks and CD ROMs and transmission type media such as digital and analogue communication links which may be used for downloading the computer program product.

What is claimed is:

1. A method of determining an overall signal generated in a substrate by a system comprising a plurality of gates, each being configured to perform a switching event, the method comprising:
   comparing output of a transistor-level model with output of a lumped circuit model for each gate and the substrate;
   determining signal contributions from each gate and switching event based on the step of comparing;
   determining switching event signals for each of the plurality of gates, the switching event signals being triggered during the system's operation;
   combining at least a part of the signal contributions and the determined switching event signals;
   deriving a combined lumped circuit model based on a combination of lumped circuit models of the plurality of gates; and
   computing the overall signal based on the combined gate signal contributions and switching event signals, which are configured as an input to the combined lumped circuit model.

2. The method of claim 1, wherein determining signal contributions comprises determining a signal generated in the substrate by the execution of a single switching event by a single gate.

3. The method of claim 1, wherein determining signal contributions comprises identifying at least one output signal of the transistor-level model that substantially matches a signal output of the lumped circuit model.

4. The method of claim 1, wherein determining signal contributions comprises identifying a substrate voltage at a node in the transistor-level model that substantially matches a substrate voltage at a node in the lumped circuit model.

5. The method of claim 1, wherein determining signal contributions comprises identifying at least one gate parameter for the lumped circuit model.

6. The method of claim 1, wherein computing the overall signal comprises inputting a combined power supply signal into the combined lumped circuit model, wherein the combined power supply signal is determined based on a combination of power supply signals of the plurality of gates.

7. The method of claim 6, further comprising at least two power supply signals to each gate of the plurality of gates.

8. The method of claim 6, further comprising at least three power supply signals to each gate of the plurality of gates.

9. The method of claim 1, further comprising providing at least one power supply signal source to the lumped circuit models.

10. The method of claim 1, wherein deriving the combined lumped circuit model is based on a packaging model of the package wherein the system is encapsulated.

11. The method of claim 1, wherein deriving the combined lumped circuit model is based on a packaging model of the package wherein the system is assumed to be encapsulated.

12. The method of claim 1, wherein deriving the combined lumped circuit model is based on a model of at least a part of the system wiring that is located outside the substrate.

13. The method of claim 1, wherein the lumped circuit model of each of the plurality of gates is based on a model of at least a part of the gate wiring.

14. The method of claim 1, further comprising:
   transmitting information relating to a description of the gate system from a transmitting location to a computer system via a telecommunications link, wherein the information is processed on the computer system; and
   transmitting to the transmitting location information relating to the overall signal.

15. A computer program that is configured to perform a method of determining an overall signal generated in a substrate by a system comprising a plurality of gates, each being configured to perform a switching event, the method comprising:
   comparing output of a transistor-level model with output of a lumped circuit model for each gate and the substrate;
   determining signal contributions from each gate and switching event based on the step of comparing;
   determining switching event signals for each of the plurality of gates, the switching event signals being triggered during the system's operation;
   combining at least a part of the signal contributions and the determined switching event signals;
   deriving a combined lumped circuit model based on a combination of lumped circuit models of the plurality of gates; and
   computing the overall signal based on the combined gate signal contributions and switching event signals, which are configured as an input to the combined lumped circuit model.

16. A computer system for determining an overall signal generated in a substrate by a gate system comprising a plurality of gates, each being configured to perform a switching event, the computer system comprising:
   a first circuit that is configured to compare output of a transistor-level model with output of a lumped circuit model for each gate and the substrate, and further configured to determine signal contributions from each gate and switching event based on outcome of the comparison, and to determine switching event signals for each of the plurality of gates, the switching event signals being triggered during the system's operation;
   a memory unit, electrically connected to the first circuit, the memory unit being configured to store the signal contributions and switching event signals; and
   a second circuit, electrically connected to the memory unit, the second circuit being configured to combine at least a part of the signal contributions and the determined switching event signals, and the second circuit being further configured to derive a combined lumped circuit model based on a combination of lumped circuit models of the plurality of gates, wherein the second circuit computes the overall signal based on the combined gate signal contributions and switching event signals, which are configured as an input to the combined lumped circuit model.

17. The computer system of claim 16, wherein a processor comprises the first and second circuits.

18. The computer system of claim 16, wherein database comprises the memory unit.

19. The computer system of claim 16, wherein the lumped circuit models of the plurality of gates include at least one power supply signal source.

20. The computer system of claim 16, wherein the combined lumped circuit model is based on a packaging model of the package wherein the gate system is encapsulated.

21. The computer system of claim 16, wherein the combined lumped circuit model is based on a packaging model of the package wherein the gate system is assumed to be encapsulated.

22. A data storage device configured to store at least one computer readable code segment, and configured to control a processing system, the code segment being executable to perform a method of determining an overall signal generated in a substrate in a gate system comprising a plurality of gates, each being configured to perform a switching event, the method comprising:

comparing output of a transistor-level model with output of a lumped circuit model for each gate and the substrate;
determining signal contributions from each gate and switching event based on the step of comparing;
determining switching event signals for each of the plurality of gates, the switching event signals being triggered during the system's operation;
combining at least a part of the signal contributions and the determined switching event signals;
deriving a combined lumped circuit model based on a combination of lumped circuit models of the plurality of gates; and
computing the overall signal based on the combined gate signal contributions and switching event signals, which are configured as an input to the combined lumped circuit model.

23. A computer system for determining an overall signal generated in a substrate by a gate system comprising a plurality of gates, each being configured to perform a switching event, the computer system comprising:

means for comparing output of a transistor-level model with output of a lumped circuit model for each gate and the substrate;
first means for determining signal contributions from each gate and switching event based on the step of comparing;
second means for determining switching event signals for each of the plurality of gates, the switching event signals being triggered during the system's operation;
means for combining at least a part of the signal contributions and the determined switching event signals;
means for deriving a combined lumped circuit model based on a combination of lumped circuit models of the plurality of gates; and
means for computing the overall signal based on the combined gate signal contributions and switching event signals, which are configured as an input to the combined lumped circuit model.

24. A method of computing the overall signal generated in a substrate by a digital system comprising a plurality of gates associated with the substrate, the overall signal being generated when the digital system would be operational resulting in a plurality of switching events of at least some of the gates, the method comprising:

for at least two of the gates
loading on a computer system a transistor-level model of the gate and the substrate and a lumped circuit model of the gate and the substrate; and
determining gate and switching event specific signal contributions for each of the switching events by matching the transistor-level model and the lumped circuit model;
determining the switching events of each of the gates triggered while the digital system is operational; and
computing the overall signal
by combining at least part of the gate and switching event specific signal contributions while exploiting the triggered switching events; and
by applying the combined gate and switching event specific signal contributions on a combined lumped circuit model of the digital device, the combined lumped circuit model being a model of the digital system and derived from a combination of the lumped circuit models of the gates.

25. The method of claim 24, wherein the substrate is at least partly high-ohmic.

26. The method of claim 25, herein the combining is adapted for handling a high-ohmic substrate.

27. The method of claim 25, wherein the combined lumped circuit model is derived based on a packaging model of the pack wherein the system is to be encapsulated.

28. The method of claim 26, wherein deriving the combined lumped circuit model is based on a model of at least a part of the system wiring that is located outside the substrate.

29. The method of claim 1, wherein the substrate is at least partly high-ohmic.

30. The method of claim 29, wherein said combining is adapted for handling a high-ohmic substrate.

31. The method of claim 29, wherein deriving the combined lumped circuit model is based, at least in part, on a packaging model of the package wherein the system is assumed to be encapsulated.

32. The method of claim 29, wherein deriving the combined lumped circuit model is based, at least in part, on a model of at least a part of the system wiring that is located outside the substrate.

* * * * *

UNITED STATES PATENT AND TRADEMARK OFFICE
CERTIFICATE OF CORRECTION

PATENT NO.    : 6,941,258 B2
DATED         : September 6, 2005
INVENTOR(S)   : Van Heijiningen et al.

It is certified that error appears in the above-identified patent and that said Letters Patent is hereby corrected as shown below:

Title page,
Item [56], References Cited, OTHER PUBLICATIONS,
"Singh et al.," reference, delete "singnal" and insert -- signal --.
"Loinaz et al.," reference, delete "199" and insert -- 1999 --.
"Mitra S. et al.," reference, after "IEEE", delete "Transactions".

Column 2,
Lines, 17, 36 and 49, delete "et.al." and insert -- et al., --.

Column 3,
Line 47, after "is" delete ",".

Column 4,
Line 45, delete "time varying" and insert -- time-varying --.

Column 6,
Line 59, after "model", insert -- . --.
Line 62, after "invention", insert -- . --.
Line 65, after "model", insert -- . --.
Line 67, after "gate", insert -- . --.

Column 7,
Line 3, after "invention", insert -- . --.

Column 9,
Line 62, delete, "Transitor" and insert -- transistor --.

Column 10,
Line 55, delete "Thereore" and insert -- Therefore --.
Line 63, delete "a" and insert -- an --.

Column 11,
Lines 37-45, delete "*".

Column 20,
Line 7, delete "(50. mv)" and insert -- (5.0 mv) --.

UNITED STATES PATENT AND TRADEMARK OFFICE
CERTIFICATE OF CORRECTION

PATENT NO.    : 6,941,258 B2
DATED         : September 6, 2005
INVENTOR(S)   : Van Heijiningen et al.

It is certified that error appears in the above-identified patent and that said Letters Patent is hereby corrected as shown below:

Column 21,
Line 57, delete "compliling" and insert -- compiling --.

Column 26,
Line 35, delete "pack" and insert -- package --.

Signed and Sealed this

Twenty-third Day of May, 2006

JON W. DUDAS
*Director of the United States Patent and Trademark Office*